US012335651B2

(12) United States Patent
Ichino et al.

(10) Patent No.: US 12,335,651 B2
(45) Date of Patent: Jun. 17, 2025

(54) PHOTOELECTRIC CONVERSION DEVICE, METHOD OF DRIVING PHOTOELECTRIC CONVERSION DEVICE, AND IMAGING SYSTEM

(71) Applicant: CANON KABUSHIKI KAISHA, Tokyo (JP)

(72) Inventors: Shinya Ichino, Tokyo (JP); Takanori Yamashita, Tokyo (JP); Tomoya Kumagai, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 192 days.

(21) Appl. No.: 18/348,084

(22) Filed: Jul. 6, 2023

(65) Prior Publication Data
US 2024/0031709 A1    Jan. 25, 2024

(30) Foreign Application Priority Data
Jul. 21, 2022  (JP) .................. 2022-116303

(51) Int. Cl.
H04N 25/78     (2023.01)
H04N 25/77     (2023.01)
H04N 25/779    (2023.01)
H10F 39/00     (2025.01)

(52) U.S. Cl.
CPC ............. H04N 25/78 (2023.01); H04N 25/77 (2023.01); H04N 25/779 (2023.01); H10F 39/8037 (2025.01); H10F 39/8053 (2025.01)

(58) Field of Classification Search
CPC ...... H04N 25/78; H04N 25/77; H04N 25/779; H10F 39/8037
See application file for complete search history.

(56) References Cited

U.S. PATENT DOCUMENTS 7,903,056 B2   3/2011   Kawasaki
9,502,451 B2   11/2016  Yamashita
9,653,498 B2   5/2017   Yamashita
(Continued)

FOREIGN PATENT DOCUMENTS

JP    2010-28434 A    2/2010
JP    2016-92792 A    5/2016
(Continued)

OTHER PUBLICATIONS

U.S. Appl. No. 18/355,599, filed Jul. 20, 2023 by Yu Arishima.

Primary Examiner — Nicholas G Giles
(74) Attorney, Agent, or Firm — VENABLE LLP

(57) ABSTRACT

A device of the disclosure comprises pixels including photoelectric converters generating charge, transistors having nodes receiving signals based on the charge, and transistors supplying reset voltage; and lines along the columns, wherein: in a first period, the node is disconnected from the converter, and signals based on the reset voltage is output from a pixel in a first row to a line, in a second period, signals based on the reset voltage and the charge transferred to the node are output from the pixel in the first row to a line, in a third period, signals based on the charge is output from a pixel in a second row to a line, in a fourth period, signals based on the charge is output from a pixel in a third row to a line, and the first period is prior to the second period, and between the third and fourth periods.

18 Claims, 14 Drawing Sheets

(56) References Cited

U.S. PATENT DOCUMENTS

| | | | |
|---|---|---|---|
| 9,749,570 B2 | 8/2017 | Yamashita | |
| 9,979,916 B2 | 5/2018 | Himaya | |
| 10,051,223 B2 | 8/2018 | Yamashita | |
| 10,057,529 B2 | 8/2018 | Saito | |
| 10,291,868 B2 * | 5/2019 | Shin | H10F 39/8037 |
| 10,742,905 B2 | 8/2020 | Iwata | |
| 10,778,920 B2 | 9/2020 | Yamashita | |
| 11,070,753 B2 | 7/2021 | Yamashita | |
| 11,082,642 B2 | 8/2021 | Fukuhara | |
| 11,284,032 B2 | 3/2022 | Shinohara | |
| 11,303,830 B2 | 4/2022 | Kumagai | |
| 11,394,908 B2 | 7/2022 | Akiyama | |
| 11,418,745 B2 | 8/2022 | Yamashita | |
| 11,509,852 B2 | 11/2022 | Suzuki | |
| 11,523,075 B2 | 12/2022 | Suzuki | |
| 11,637,981 B2 | 4/2023 | Yamashita | |
| 2010/0012993 A1 | 1/2010 | Yamashita et al. | |
| 2018/0227520 A1 * | 8/2018 | Shin | H04N 25/76 |
| 2023/0292024 A1 | 9/2023 | Ichino | |

FOREIGN PATENT DOCUMENTS

| | | |
|---|---|---|
| JP | 2019-103030 A | 6/2019 |
| JP | 2022-49487 A | 3/2022 |

\* cited by examiner

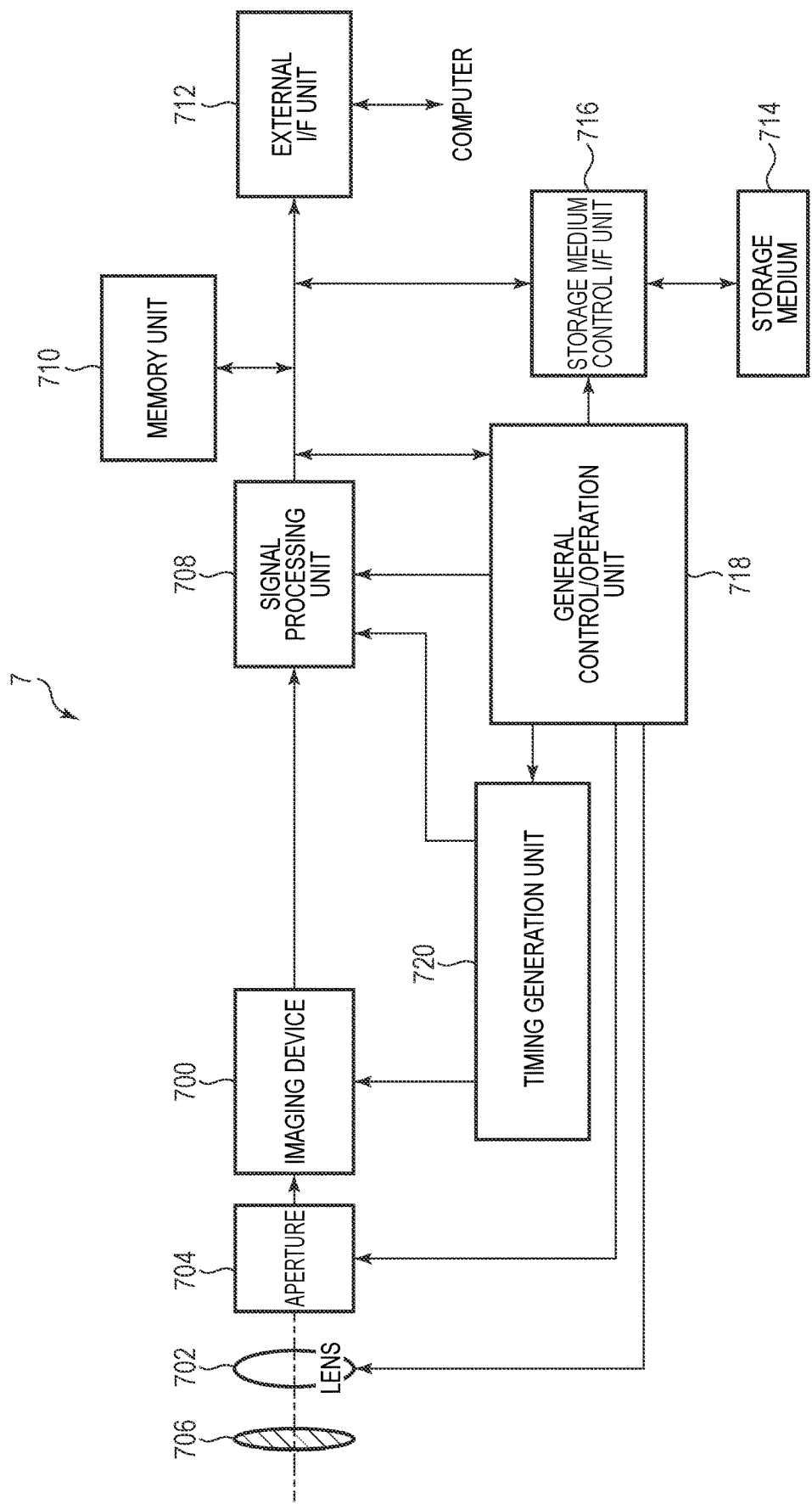

PHOTOELECTRIC CONVERSION DEVICE, METHOD OF DRIVING PHOTOELECTRIC CONVERSION DEVICE, AND IMAGING SYSTEM

BACKGROUND

Field

The present disclosure relates to a photoelectric conversion device, a method of driving photoelectric conversion device, and an imaging system.

Description of the Related Art

Japanese Patent Application Laid-Open No. 2010-28434 discloses a solid-state imaging apparatus in which the reduction of saturated electrons is suppressed by reducing a pixel size, which is realized by sharing an input node (floating diffusion layer) between multiple photoelectric conversion units.

However, in the solid-state imaging apparatus described in Japanese Patent Application Laid-Open No. 2010-28434, deterioration in image quality may occur when reading out a signal from the shared input node.

The present disclosure has been made in view of the above problems, and it is an object of the present disclosure to suppress deterioration in image quality that may occur when reading out a signal input to the shared input node.

SUMMARY

A photoelectric conversion device according to one aspect of the present disclosure comprises: a plurality of pixels arranged across multiple rows and multiple columns, each pixel including a plurality of photoelectric conversion elements generating charge, an amplification transistor having an input node for receiving a signal that is based on the charge generated in the plurality of photoelectric conversion elements, and a reset transistor supplying a reset voltage to the input node; and a plurality of output lines disposed for the pixels that are arranged along the columns, wherein in a first period, the input node is electrically disconnected from the plurality of photoelectric conversion elements, and a signal based on the reset voltage at the input node is output from a pixel arranged in a first row of the multiple rows to one of the output lines, wherein in a second period, a signal based on the reset voltage at the input node and a signal based on the charge transferred to the input node are output from the pixel arranged in the first row to one of the output lines, wherein in a third period, a signal based on the charge transferred to the input node is output from a pixel arranged in a second row of the multiple rows to one of the output lines, the second row being different from the first row, wherein in a fourth period, a signal based on the charge transferred to the input node is output from a pixel arranged in a third row of the multiple rows to one of the output lines, the third row being different from the first and second rows, and wherein the first period is a period prior to the second period, and is a period between the third and fourth periods.

Further features of the present disclosure will become apparent from the following descriptions of the exemplary embodiments with reference to the attached drawings.

BRIEF DESCRIPTION OF THE DRAWINGS

FIG. 12 is a block diagram showing a configuration example of a device according to the third embodiment.

DESCRIPTION OF THE EMBODIMENTS

Figure 1:
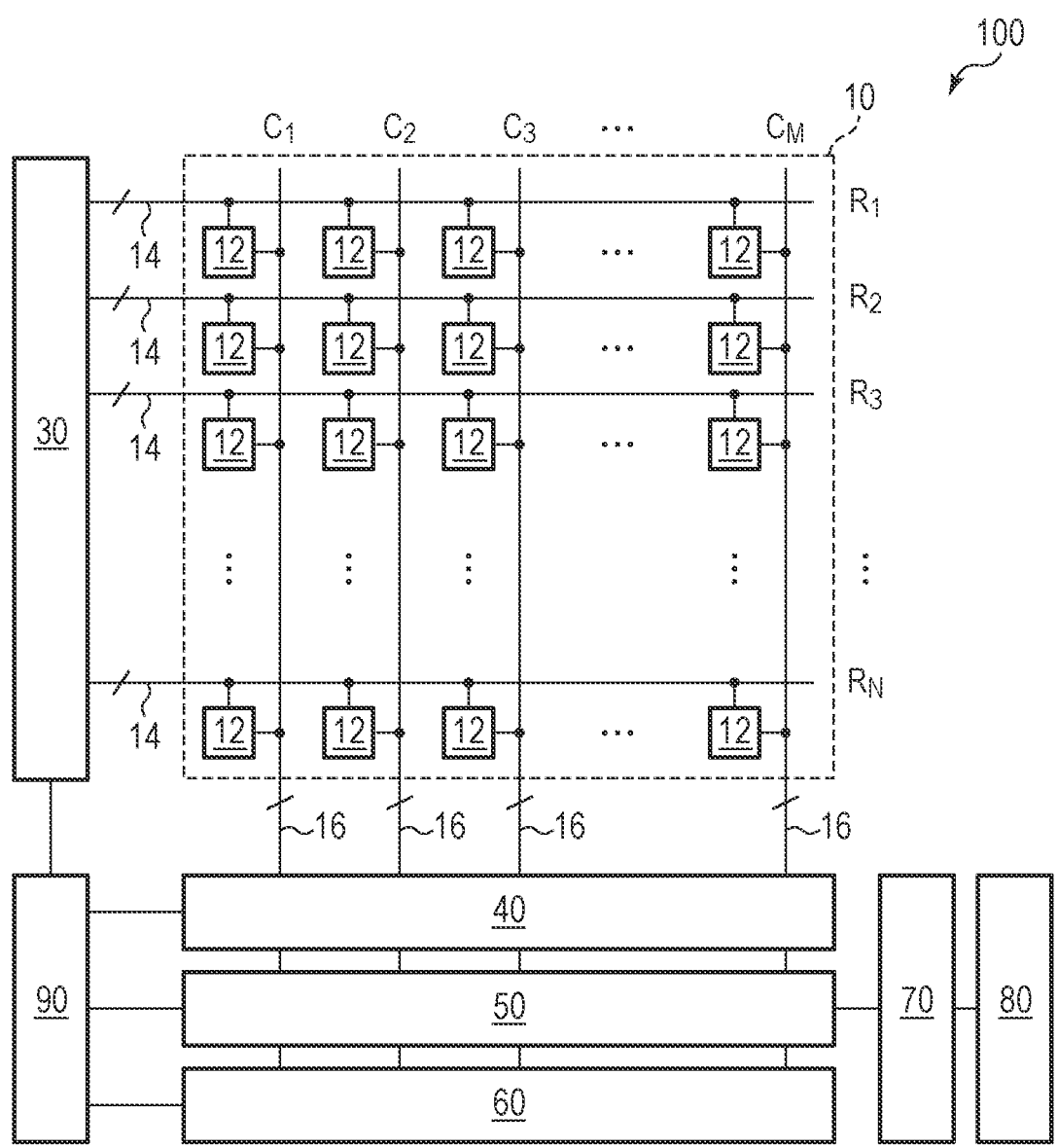
FIG. 1 is a block diagram of a photoelectric conversion apparatus according to the first embodiment.

Each embodiment will be described below with reference to the drawings. In the description of each embodiment, the same components as those of other embodiments may be indicated by the same reference numerals and the description thereof may be omitted.

First Embodiment

The photoelectric conversion apparatus according to the present embodiment and its driving method will be described with reference to FIGS. 1 to 6. FIG. 1 is a block diagram of a photoelectric conversion apparatus according to the first embodiment. A photoelectric conversion apparatus 100 according to the present embodiment includes a pixel array 10, a vertical drive circuit 30, an output line drive circuit 40, a column circuit unit 50, a horizontal drive circuit 60, a signal processing unit 70, an output circuit 80, and a system controller 90.

The pixel array 10 is provided with multiple unit pixels 12 arranged over multiple rows and multiple columns, and outputs pixel signals corresponding to the amount of light received, in which each unit pixel 12 is provided with a photoelectric conversion unit for generating and accumulating signal charges based on incident light. In this specification, the row direction indicates the horizontal direction in FIG. 1, and the column direction indicates the vertical direction crossing the row direction in FIG. 1. FIG. 1 shows unit pixels 12 of N rows and M columns comprising $R_1$ to $R_N$ rows and $C_i$ to $C_M$ columns. The pixel array 10 may include multiple pixels, such as optical black pixels that are light-shielded photoelectric conversion units and dummy pixels that do not output signals, in addition to effective pixels that output pixel signals corresponding to the amount of light of incident light. A microlens for condensing incident light and a color filter for selectively transmitting light of a predetermined color can be arranged on the unit pixel 12.

In each row of the pixel array 10, control lines 14 extend in the row direction. Each of the control lines 14 is connected to the multiple unit pixels 12 arranged in the same row and forms a common signal line to the multiple unit pixels 12. Each of the control lines 14 may include multiple signal lines. The control line 14 is connected to the vertical drive circuit 30.

Vertical output lines 16 extend in the column direction in each column of the pixel array 10. Each of the vertical output lines 16 is connected to the multiple unit pixels 12 arranged in the same row, and forms a common signal line to the multiple unit pixels 12. Each of the vertical output lines 16 may include multiple output lines. The vertical output line 16 is connected to the output line drive circuit 40.

The vertical drive circuit 30 comprises a shift register, a gate circuit, a buffer circuit, an address decoder, and the like. The vertical drive circuit 30 supplies a control signal to the unit pixel 12 via the control line 14 based on a vertical synchronization signal, a horizontal synchronization signal, a clock signal and the like supplied from the system controller 90, and drives the unit pixels 12 for each row. The signal read out from the unit pixel 12 in a row unit is input to the output line drive circuit 40 via the vertical output lines 16 provided in each column of the pixel array 10.

The output line drive circuit 40 controls the connection between the pixel array 10 and the column circuit unit 50 and the potential of the vertical output line 16 based on the control signal supplied from the system controller 90. The detailed configuration of the output line drive circuit 40 will be described later with reference to FIG. 4.

The column circuit unit 50 is connected to the vertical output line 16 through the output line drive circuit 40. The column circuit unit 50 performs predetermined signal processing on a pixel signal output through the vertical output line 16, and holds the pixel signal subjected to the signal processing.

The horizontal drive circuit 60 includes a shift register, an address decoder, and the like. The horizontal drive circuit 60 generates a control signal that is used for reading a pixel signal from the column circuit unit 50 based on a control signal supplied from the system controller 90, and supplies the control signal to the column circuit unit. The horizontal drive circuit 60 sequentially transfers the pixel signals held in the column circuit unit 50 to the signal processing unit 70.

The signal processing unit 70 performs signal processing such as arithmetic processing, amplification processing, and correction processing by using the correlated double sampling (CDS) on the pixel signal transferred from the column circuit unit 50.

The output circuit 80 has an external interface circuit and outputs the signal processed by the signal processing unit 70 to the outside of the photoelectric conversion apparatus 100. The external interface circuit of the output circuit 80 may be, for example, a SerDes (SERializer/DESerializer) transmission circuit such as a LVDS (Low Voltage Differential Signaling) circuit or a SLVS (Scalable Low Voltage Signaling) circuit.

The system controller 90 generates control signals for controlling the operation of the vertical drive circuit 30, the output line drive circuit 40, the column circuit unit 50, the horizontal drive circuit 60, etc., and supplies the generated control signals to each circuit. The system controller 90 may supply the control signals to all of the vertical drive circuit 30, the output line drive circuit 40, the column circuit unit 50, and the horizontal drive circuit 60, and may supply the control signals to only some of the circuits. To a circuit which does not receive the control signal from the system controller 90, the control signal can be supplied from the outside of the photoelectric conversion apparatus 100. The vertical drive circuit 30 starts the vertical drive of each row of the pixel array typically by a vertical synchronization signal supplied from the system controller 90. Typically, once this vertical synchronization signal is activated, each row of the pixel array 10 is driven vertically once. Thus, a signal is read from a unit pixel of each row of the pixel array 10.

Figure 2:
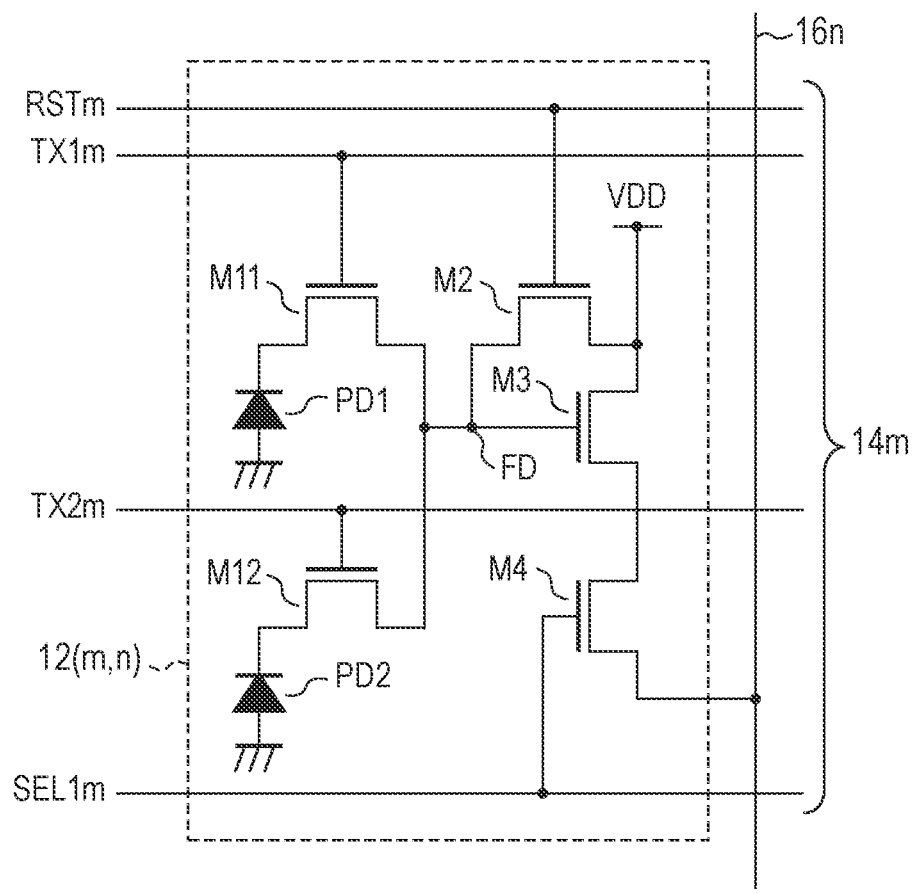
FIG. 2 is an equivalent circuit diagram of a unit pixel in the first embodiment.

FIG. 2 is an equivalent circuit diagram of a unit pixel in the present embodiment. FIG. 2 shows the unit pixel 12($m$, $n$) arranged in the m-th row and n-th column, where m is an integer from 1 to M and n is an integer from 1 to N. Other unit pixels 12 that constitute the pixel array 10 may include circuitry similar to the unit pixel 12($m$, $n$).

The unit pixel 12($m$, $n$) includes photoelectric conversion elements PD1, PD2, transfer transistors M11, M12, a reset transistor M2, an amplification transistor M3, and a selection transistor M4.

The photoelectric conversion elements PD1 and PD2 are photodiodes, for example, operable to perform the photoelectric conversion of incident light to accumulate charges. Anodes of the photoelectric conversion elements PD1 and PD2 are connected to a reference voltage node. A reference voltage (for example, ground voltage GND) is supplied from the reference voltage node to the anodes of the photoelectric conversion elements PD1 and PD2. Cathodes of the photoelectric conversion elements PD1 and PD2 are connected to the source nodes of the transfer transistors M11 and M12, respectively. It should be noted that the photodiode may be replaced by a photoelectric conversion film of an organic material, a photogate, or the like, which produces a photoelectric effect. The number of photoelectric conversion elements per unit pixel 12 is not limited to two. For example, three or more photoelectric conversion elements may be included in a unit pixel and the three or more photoelectric conversion elements may be configured to share one microlens. Color filters of a different colors may be provided for the respective photoelectric conversion elements included in the unit pixel 12.

The transfer transistor M11 is provided for transferring the charge held by the photoelectric conversion element PD1 to a node FD. A control signal TX1$m$ is supplied to a gate node of the transfer transistor M11 from the vertical drive circuit 30 via a control line 14$m$ of the m-th row. When the control signal TX1$m$ reaches a high level, the charge generated and accumulated by the light incident on the photoelectric conversion element PD1 is transferred to the node FD via the transfer transistor M11. The node FD is a so-called floating diffusion unit (floating diffusion) and is composed of wirings and electrodes of: the drain of the transfer transistor M11; the drain of the transfer transistor M12; the source of the reset transistor M2; and the gate of the amplification transistor M3. The floating diffusion unit includes a capacitance component (floating diffusion capacity) and functions as a charge holding unit. The floating diffusion capacitance may include p-n junction capacitance, wiring capacitance, etc.

The transfer transistor M12 is provided for transferring the charge held by the photoelectric conversion element PD2 to the node FD. A control signal TX2$m$ is supplied to the gate node of the transfer transistor M12 from the vertical drive circuit 30 via the control line 14$m$. When the control signal TX2$m$ reaches a high level, the charge generated and accumulated by the light incident on the photoelectric conversion element PD2 is transferred to the node FD via the transfer transistor M12. The node FD is shared by the photoelectric conversion element PD1 and the photoelectric conversion element PD2, and is an input node to which signals from the photoelectric conversion elements PD1 and PD2 are input.

The charges transferred from the photoelectric conversion elements PD1 and PD2 are held in the floating diffusion capacity of the node FD. The charge held in the node FD is converted into a voltage. That is, the voltage at the node FD corresponds to the amount of charge transferred from the photoelectric conversion elements PD1 and PD2.

The reset transistor M2 is provided for resetting the potential of the node FD to a voltage corresponding to the power supply voltage VDD. The source node of the reset transistor M2 corresponds to the node FD, and a power supply voltage VDD is applied to the drain node. The control signal RSTm is supplied from the vertical drive circuit 30 to the gate node of the reset transistor M2 via the control line 14m. When the control signal RSTm reaches a high level, the potential of the node FD is reset to a voltage corresponding to the power supply voltage VDD. When the control signal RSTm becomes high and the control signals TX1m and TX2m become high, the voltages of the photoelectric conversion elements PD1 and PD2 can be reset to a voltage corresponding to the power supply voltage VDD.

The amplification transistor M3 outputs a signal to the n-th column vertical output line 16n via the selection transistor M4. The power supply voltage VDD is applied to the drain node of the amplification transistor M3. The source node of the amplification transistor M3 is connected to the drain of the selection transistor M4. The gate node of the amplification transistor M3 corresponds to the node FD. The amplification transistor M3 constitutes a source follower together with a current source that will be described later. The voltage of the node FD is current-amplified (buffered) by the amplification transistor M3 and appears as a voltage change on the vertical output line 16n.

The selection transistor M4 is provided between the amplification transistor M3 and the vertical output line 16n. The amplification transistor M3 is electrically connected to the vertical output line 16n via the selection transistor M4. A control signal SEL1m is supplied to the gate node of the selection transistor M4 from the vertical drive circuit 30 via the control line 14m. When the control signal SEL1m transitions to a high level, the selection transistor M4 transfers an output from the amplification transistor M3 to the vertical output line 16n.

In the present embodiment, pixel elements contributing to the readout of the signal from the photoelectric conversion element PD1 include the transfer transistor M11, the reset transistor M2, the amplification transistor M3, and the selection transistor M4. The pixel element contributing to the readout of the signal from the photoelectric conversion element PD2 includes the transfer transistor M12, the reset transistor M2, the amplification transistor M3, and the selection transistor M4. The amplification transistor M3 may output a signal based on a reset signal for resetting the node FD from the reset transistor M2 and a signal based on each signal from the photoelectric conversion elements PD1 and PD2 to the same output line via the selection transistor M4.

As shown in FIG. 2, the control line 14 of each row includes four signal lines connected to the gate of the transfer transistor M11, the gate of the transfer transistor M12, the gate of the reset transistor M2, and the gate of the selection transistor M4. If the respective transistors M11, M12, M2 and M4 are composed of n-type MOS transistors, the transistors M11, M12, M2 and M4 are turned on when a high-level control signal is supplied from the vertical drive circuit 30. When a low-level control signal is supplied from the vertical drive circuit 30, the transistors M11, M12, M2, and M4 are turned off. In the present embodiment, a case will be described where electrons are used as signal charges among electron hole pairs generated in the photoelectric conversion elements PD1 and PD2 by incident light. If electrons are used as the signal charge, each transistor constituting the unit pixel 12 may be composed of an n-type MOS transistor. However, the signal charge is not limited to electrons, and holes may be used as the signal charge. If holes are used as the signal charge, the conductive type of each transistor is the opposite of that described in the present embodiment. Note that the source and drain names of the MOS transistor may differ depending on the conductive type of the transistors and the functions of interest. Some or all of the source and drain names used in the present embodiment may be referred to by the opposite name.

By properly controlling the transfer transistors M11 and M12, the reset transistor M2, and the selection transistor M4, a signal corresponding to the reset voltage of the node FD and signals corresponding to the amounts of light incident on the photoelectric conversion elements PD1 and PD2 are read out from each unit pixel 12. In the following description, the signal corresponding to the reset voltage of the node FD is referred to as a noise signal or an N signal, and the signals corresponding to the amounts of light incident on the photoelectric conversion elements PD1 and PD2 are referred to as photoelectric conversion signals or S signals. The S signal may be a signal obtained by combining an N signal and the signal corresponding to the amount of light incident on the photoelectric conversion element PD1/PD2.

As shown in FIG. 2, in the present embodiment, two photoelectric conversion elements PD1 and PD2 included in the unit pixel 12 share the node FD that is a floating diffusion unit. A pixel signal based on the charge generated by the photoelectric conversion element PD1 and a signal based on the charge generated by the photoelectric conversion element PD2 can be read from the unit pixel 12 separately. For example, first the N signal and the S signal based on the charge generated by the photoelectric conversion element PD1 can be read out, and then the N signal and the S signal based on the charge generated by the photoelectric conversion element PD2 can be read out.

Figure 3:
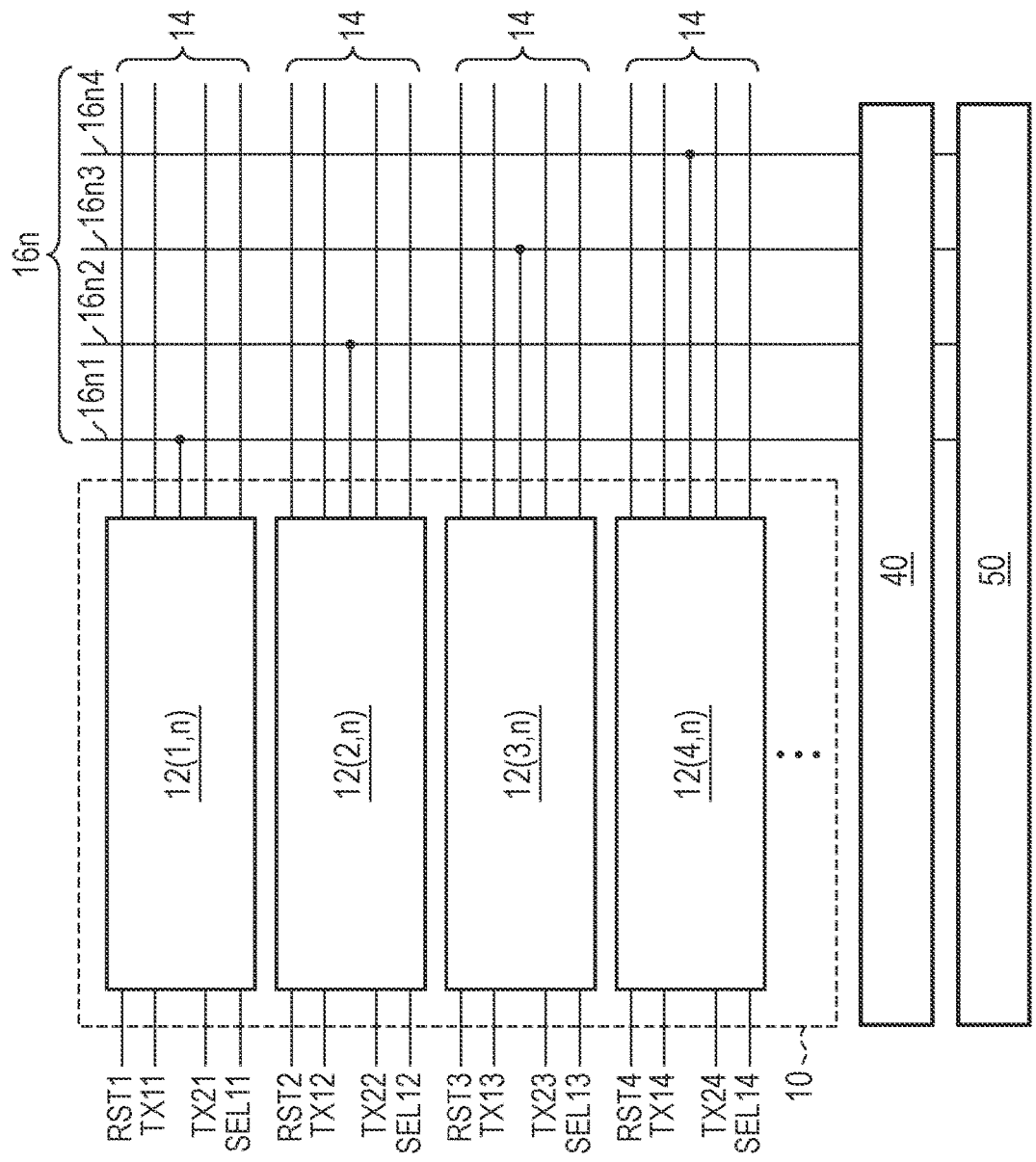
FIG. 3 is a schematic diagram showing a connection example of a unit pixel in the first embodiment.

FIG. 3 is a schematic diagram showing an example of connection between a unit pixel and a vertical output line in the first embodiment. In the following descriptions, as an example, the vertical output line 16n of the n-th column include four output lines, but the number of output lines included in the vertical output line 16n of each column is not limited to four.

As shown in FIG. 3, the vertical output line 16n including four output lines 16n1 to 16n4 are arranged in the n-th column of the pixel array 10. The unit pixel 12 of each row is connected to any one of four output lines of the vertical output line 16n arranged in the corresponding common n-th column. For example, as shown in FIG. 3, the unit pixel 12(1, n) arranged in the first row and the n-th column is connected to the output line 16n1 of the vertical output line 16n. Similarly, the unit pixels 12(2, n) to 12(4, n) arranged in the second to fourth rows and the n-th column are respectively connected to the output lines 16n2 to 16n4. The unit pixels 12 in the fifth and subsequent lines are also connected to any one of the output lines 16n1 to 16n4 for every four lines as well as the unit pixels 12 arranged in the first to fourth lines.

The control signals RSTm, TX1m, TX2m, and SEL1m are supplied from the vertical drive circuit 30 to the unit pixels 12 disposed in the m-th row. For example, control signals RST1 to RST4, TX11 to TX14, TX21 to TX24, and SEL11 to SEL14 are supplied from the vertical drive circuit 30 to the unit pixels 12(1, n) to 12(4, n) arranged in the first to fourth rows. Similar control signals can also be supplied from the vertical drive circuit 30 for the unit pixels 12 after the fifth row.

In the unit pixel 12 of the present embodiment, the reset transistor M2, the amplification transistor M3 and the selection transistor M4 are shared by a pixel including the photoelectric conversion element PD1 and the transfer transistor M11 and a pixel including the photoelectric conversion element PD2 and the transfer transistor M12. According to the above-described configuration by the present embodiment, the number of transistors per pixel can be reduced as compared with the configuration of each pixel having the reset transistor M2, the amplification transistor M3 and the selection transistor M4. Thus, for example, if there is a same area given for the photoelectric conversion elements in a certain layout, the pixels can be scaled down compared to a configuration in which each pixel has the reset transistor M2, the amplification transistor M3 and the selection transistor M4.

On the other hand, if the total number of pixels to be read out increases with the scaling of pixels, the readout time per frame increases. However, in the photoelectric conversion apparatus of the present embodiment, the vertical output lines 16 including multiple output lines are arranged in each pixel row. Therefore, the number of rows of pixels read out at the same time can be increased and the readout time per frame can be shortened. In other words, according to the photoelectric conversion apparatus according to the present embodiment allows to achieve both the die shrink of pixels and the high-speed readout. One frame may be a period for obtaining one image. One frame period, which is a period for obtaining a signal of one frame, may be a period from the time when a signal of a pixel row is read out to the time when the signal of the same row is read out again. If the vertical drive circuit 30 is controlled by the vertical synchronization signal, one frame period can be described as a period from the time when the vertical synchronization signal is activated to the time when the vertical synchronization signal is reactivated.

Figure 4:
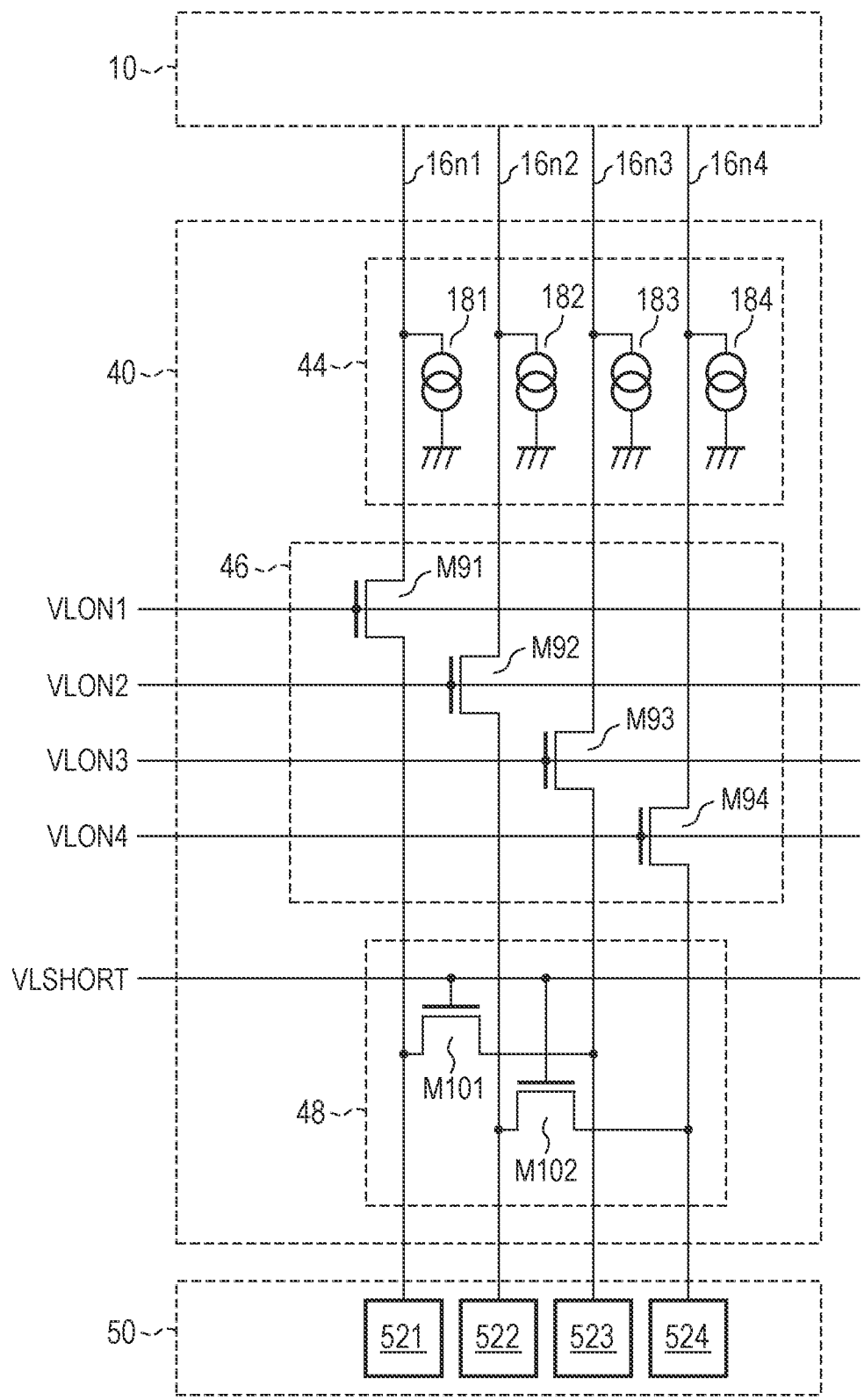
FIG. 4 is a circuit diagram of a photoelectric conversion apparatus according to the first embodiment.

FIG. 4 is a circuit diagram of the photoelectric conversion apparatus according to the present embodiment. FIG. 4 shows the pixel array 10, the output line drive circuit 40, the column circuit unit 50, and the output lines 16n1 to 16n4 of the n-th row.

The output line drive circuit 40 has a current source circuit 44, a connection circuit 46, and a connection circuit 48. The current source circuit 44 includes four current sources 181 to 184 corresponding to the number of the output lines 16n1 to 16n4 included in the n-th row of the vertical output line 16n. The connection circuit 46 includes four connection switches M91 to M94 corresponding to the number of the output lines 16n1 to 16n4 included in the vertical output line 16n. The connection circuit 48 may include two connection switches M101, M102 corresponding to the number of the output lines 16n1 to 16n4 included in the vertical output line 16n. If the number of output lines included in the vertical output line 16n is K, the connection circuit 48 may include the number (K−2) of connection switches. The output line drive circuit 40 may include a similar circuit configuration for each of the first to N-th rows of the pixel array 10.

The drain node of the connection switch M91 is connected to the pixel array 10 via the output line 16n1. The source node of the connection switch M91 is connected to the column circuit unit 50 via the output line 16n1. A control signal VLON1 is supplied from the system controller 90 to the gate node of the connection switch M91. The connection switch M91 may be composed of an n-type MOS transistor. In this case, when the control signal VLON1 reaches a high level, the connection switch M91 is turned on (i.e., in a conductive state). When the control signal VLON1 reaches a low level, the connection switch M91 is turned off (i.e., in a non-conductive state). The connection switches M92 to M94 are configured in the same manner as the connection switch M91. That is, the drain nodes of the connection switches M92 to M94 are respectively connected to the pixel array 10 via the output lines 16n2 to 16n4. The source nodes of the connection switches M92 to M94 are respectively connected to the column circuit unit 50 via the output lines 16n2 to 16n4. Control signals VLON2 to VLON4 are respectively supplied from the system controller 90 to the gate nodes of the connection switches M92 to M94.

The drain node of the connection switch M101 is connected to the source node of the connection switch M91 and the column circuit unit 50 through the output line 16n1. The source node of the connection switch M101 is connected to the source node of the connection switch M93 and the column circuit unit 50 through the output line 16n3. The drain node of the connection switch M102 is connected to the source node of the connection switch M92 and the column circuit unit 50 through the output line 16n2. The source node of the connection switch M102 is connected to the source node of the connection switch M94 and the column circuit unit 50 through the output line 16n4. A control signal VLSHORT is supplied from the system controller 90 to the gate nodes of the connection switches M101 and 102. The connection switches M101 and 102 may be composed of n-type MOS transistors. In this case, when the control signal VLSHORT reaches a high level, the output line 16n1 and the output line 16n3 are electrically connected, and the output line 16n2 and the output line 16n4 are electrically connected.

The column circuit unit 50 includes four column circuits 521 to 524 corresponding to the number of the output lines 16n1 to 16n4 included in the vertical output line 16n. Each of the column circuits 521 to 524 includes a processing circuit and a signal holding circuit. Each processing circuit performs signal processing such as amplification processing, correction processing by the CDS, and analog-to-digital (A/D) conversion processing on the pixel signals output through the corresponding output lines 16n1 to 16n4. The signal holding circuit functions as a memory for holding the pixel signal processed by the processing circuit.

The output line 16n1 may be connected from the pixel array 10 to the column circuit 521 via the connection switch M91. Similarly, the output lines 16n2 to 16n4 may be connected from the pixel array 10 to the column circuit 522 to 524 via the connection switches M92 to M94, respectively. If the pixel signal is not read out on the output line 16n1, the connection switch M91 corresponding to the output line 16n1 is turned off based on the control signal VLON1, and the output line 16n1 is electrically disconnected from the column circuit unit 50. Similarly, if the pixel signals are not read out on the output lines 16n2 to 16n4, the connection switches M92 to M94 are turned off based on the control signals VLON2 to VLON4, respectively, and the output lines 16n2 to 16n4 are electrically disconnected from the column circuit unit 50, respectively.

The current source 181 is connected to the output line 16n1. The output line 16n1 supplies a bias current supplied from the current source 181 to the amplification transistor M3 included in the unit pixel 12(1, n) via the selection transistor M4. Similarly, the current sources 182 to 184 are connected to the output lines 16n2 to 16n4, respectively. The output lines 16n2 to 16n4 supply bias current supplied from the current sources 182 to 184 to the amplification transistor M3 included in each of the unit pixels 12(2, n) to 12(4, n) via the selection transistor M4.

Based on the control signals VLON1 to VLON4 and VLSHORT supplied from the system controller 90, the output line drive circuit 40 controls the connection between the pixel array 10 and the column circuit unit 50. For example, if the connection switches M91 and M101 as first and third switches are turned on and the connection switch M93 as a second switch is turned off, the output line 16n1 as a first output line is connected to the two column circuits 521 and 523 through the connection switches M91 and M101. Since the connection switch M93 is in OFF state, the signal from the output line 16n3 as a second output line is not input to the column circuit unit 50. By controlling the connection between the pixel array 10 and the column circuit unit 50 in the above manner, the output line drive circuit 40 can cause the two column circuits 521 and 523 to output the pixel signals read out from the unit pixel 12(1, n) as a first pixel to the output line 16n1. Similarly, the output line drive circuit 40 can output the pixel signal read out from the unit pixel 12(3, n) as a second pixel to the output line 16n3 to the two column circuits 521 and 523. That is, the output line drive circuit 40 can cause two column circuits to process a pixel signal from a single output line. For example, multi-sampling driving can be performed in which pixel signals processed by the two column circuits 521 and 523 are averaged and output as a single pixel signal. Further, according to the present embodiment, the high dynamic range (HDR) driving can be performed in which pixel signals from a single output line are amplified with different gains through the two column circuits 521 and 523, and the two amplified pixel signals are combined and output. The arrangement of the connection switches M101 and M102 can be changed depending on the number of output lines in each column, the readout operation, etc. For example, the connection switch M101 may be disposed between the output line 16n1 and the output line 16n2, and the connection switch M102 may be disposed between the output line 16n3 and the output line 16n4. The connection switch M101 may be disposed between the output line 16n1 and the output line 16n4, and the connection switch M102 may be disposed between the output line 16n2 and the output line 16n3, respectively. The number of the output lines connected to the connection switches M101 and M102 is not limited to two but may be three or more.

Figure 5:
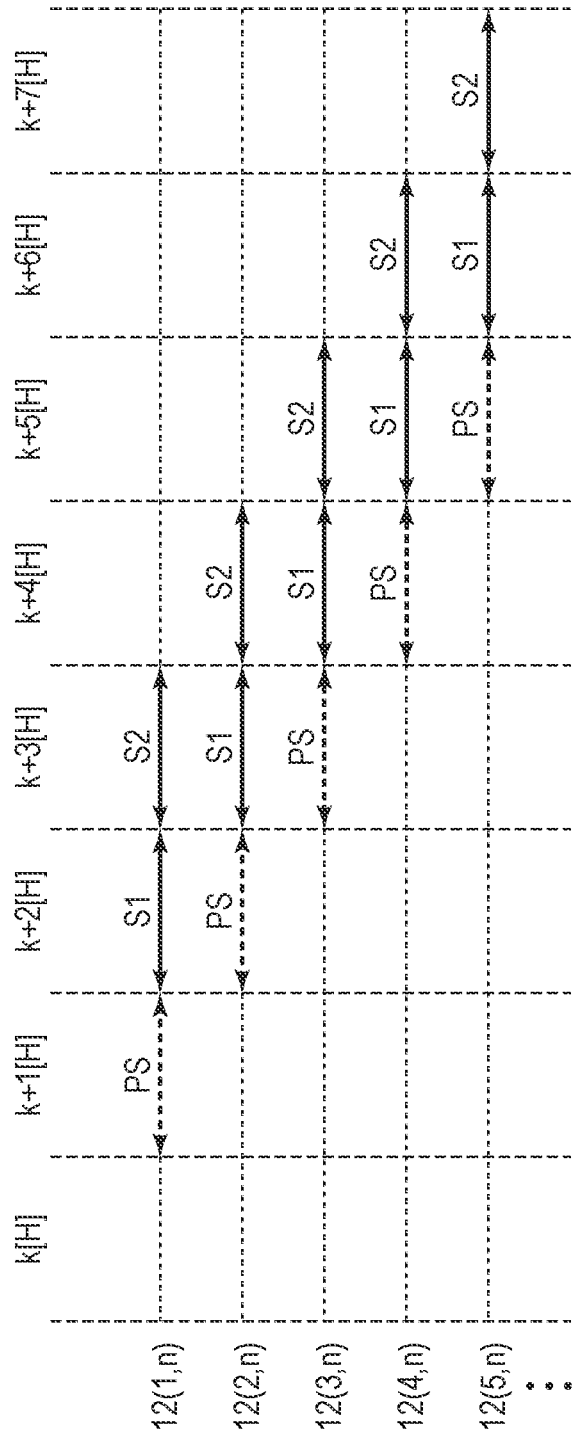
FIG. 5 is a sequence diagram showing the operation of the photoelectric conversion apparatus according to the first embodiment.

FIG. 5 is a sequence diagram showing an operation of the photoelectric conversion apparatus according to the present embodiment, and shows an example of an operation when a pixel signal is read out from the unit pixels 12(1, n) to 12(5, n).

According to the operation example shown in FIG. 5, a part of the output lines 16n1 to 16n4 included in the vertical output line 16n is used for reading the pixel signal in each horizontal scanning period. Specifically, when two of the connection switches M91 to M94 (for example, the connection switches M91, M92) are turned on, two of the four output lines 16n1 to 16n4 (for example, output lines 16n1, 16n2) are connected to the unit pixels (for example, unit pixels 12(1, n), 12(2, n)). The four column circuits 521 to 524 read out pixel signals from the two output lines (16n1, 16n2) through the connection switches M101 and M102, respectively. In the following descriptions, the above operation is referred to as the first driving mode.

The unit pixel 12 includes multiple photoelectric conversion elements, e.g., two photoelectric conversion elements PD1 and PD2 as first and second photoelectric conversion elements, respectively. Accordingly, two consecutive horizontal scanning periods are required to sequentially read out pixel signals from the respective photoelectric conversion elements via multiple transfer transistors. For example, in a first readout period S1, which is a horizontal scanning period, the N signal and the S signal are read out as pixel signals from the photoelectric conversion element PD1 of the unit pixel 12(1, n). Then, in a second readout period S2, which is a horizontal scanning period, the N signal and the S signal are read out as pixel signals from the photoelectric conversion element PD2 of the unit pixel 12(1, n).

In the following descriptions, the readout operation performed before the first readout period S1 and performed based on the actual readout operation of the pixel signal is referred to as a preliminary selection driving or a preliminary selection drive. The horizontal scanning period in which the preliminary selection driving is performed is referred to as a preliminary selection period PS.

FIG. 5 shows a sequence in horizontal scan periods k to k+7 where k is an integer. In FIG. 5, the symbol [H] indicates a horizontal scanning period. During the horizontal scanning period k, pixel signal is not read out from any of the unit pixels 12(1, n) to 12(5, n).

The horizontal scanning period k+1 corresponds to the preliminary selection period PS of the unit pixel 12(1, n). That is, during the horizontal scanning period k+1, the preliminary selection driving is performed on the unit pixel 12(1, n).

The horizontal scanning period k+2 corresponds to the first readout period S1 of the unit pixel 12(1, n) and the preliminary selection period PS of the unit pixel 12(2, n), respectively. That is, in the horizontal scanning period k+2, a pixel signal from the photoelectric conversion element PD1 of the unit pixel 12(1, n) is read out, and the preliminary selection driving is performed on the unit pixel 12(2, n).

The horizontal scanning period k+3 corresponds to the second readout period S2 of the unit pixel 12(1, n), the first readout period S1 of the unit pixel 12(2, n), and the preliminary selection period PS of the unit pixel 12(3, n), respectively. That is, in the horizontal scanning period k+3, a pixel signal from the photoelectric conversion element PD2 of the unit pixel 12(1, n) is read out, a pixel signal from the photoelectric conversion element PD1 of the unit pixel 12(2, n) is read out, and the preliminary selection drive is performed on the unit pixel 12(3, n).

The horizontal scanning period k+4 corresponds to the second readout period S2 of the unit pixel 12(2, n), the first readout period S1 of the unit pixel 12(3, n), and the preliminary selection period PS of the unit pixel 12(4, n), respectively. That is, in the horizontal scanning period k+4, a pixel signal from the photoelectric conversion element PD2 of the unit pixel 12(2, n) is read out, a pixel signal from the photoelectric conversion element PD1 of the unit pixel 12(3, n) is read out, and the preliminary selection drive is performed on the unit pixel 12(4, n).

The horizontal scanning period k+5 corresponds to the second readout period S2 of the unit pixel 12(3, n), the first readout period S1 of the unit pixel 12(4, n), and the preliminary selection period PS of the unit pixel 12(5, n), respectively. That is, in the horizontal scanning period k+5, a pixel signal from the photoelectric conversion element PD2 of the unit pixel 12(3, n) is read out, a pixel signal from the photoelectric conversion element PD1 of the unit pixel 12(4, n) is read out, and the preliminary selection drive is performed on the unit pixel 12(5, n).

The horizontal scanning period k+6 corresponds to the second readout period S2 of the unit pixel 12(4, n) and the first readout period S1 of the unit pixel 12(5, n), respectively. That is, in the horizontal scanning period k+6, a pixel signal from the photoelectric conversion element PD2 of the unit pixel 12(4, n) is read out, and a pixel signal from the photoelectric conversion element PD1 of the unit pixel 12(5, n) is read out.

The horizontal scanning period k+7 corresponds to the second readout period S2 of the unit pixel 12(5, n). That is, in the horizontal scanning period k+7, a pixel signal from the photoelectric conversion element PD2 of the unit pixel 12(5, n) is read out.

For example, if the horizontal scanning periods k+4 and k+5 are considered as first and second periods, respectively, and the unit pixel 12(4, n) is considered as a unit pixel of the first row, the preliminary selection driving is performed on the unit pixel of the first row in the first period, and the pixel signal from the photoelectric conversion element PD1 of the unit pixel of the first row is read out in the second period. If the horizontal scanning period k+3 is considered as a third period and the unit pixel 12(2, n) is considered as a second row of unit pixels, the pixel signal from the photoelectric conversion element PD1 of the second row of unit pixels is read out in the third period. If the horizontal scanning period k+6 is considered as a fourth period and the unit pixel 12(5, n) is considered as a unit pixel of the third row, the pixel signal from the photoelectric conversion element PD1 of the unit pixel of the third row is read out in the fourth period. Here, the first period precedes the second period and is a period between the third period and the fourth period. The first to third row unit pixels may be arranged adjacent to each other or not adjacent to each other. Further, if the unit pixel 12(1, n) is considered as a unit pixel of the fourth row, the first and second periods are included in a period after the pixel signal from the photoelectric conversion element PD1 of the unit pixel of the fourth row is read out and before the pixel signal from the photoelectric conversion element PD1 of the unit pixel of the fourth row is read out again. The first period, the second period and the third period are periods included in a single frame period. For example, the first period, the second period, and the third period are included in a period starting from the time when the signal of the unit pixel of the fourth row is read out to the time when the signal of the unit pixel of the fourth row is read out again.

As described above, in one horizontal scanning period just before the second readout period S2, the readout operation of pixel signal in the first readout period S1 is performed, and in one horizontal scanning period just before the first readout period S1, the preliminary selection driving that is similar to or substantially same as the actual readout operation of the pixel signal is performed. That is, the preliminary selection period PS as a first period and the first readout period S1 and the second readout period S2 as a second period form three consecutive horizontal scanning periods. The effect of the preliminary selection driving will be described in detail below in comparison with the case where the preliminary selection driving is not performed.

If the preliminary selection driving is not performed, the operation corresponding to the readout of the pixel signal is not performed in one horizontal scanning period just before the first readout period S1, and the reset operation for the unit pixel 12 continues for at least one horizontal scanning period. On the other hand, in one horizontal scanning period just before the second readout period S2, the pixel signal is read out by the first readout period S1. That is, if the preliminary selection driving is not performed, the operation of the unit pixel 12 in one horizontal scanning period just before the first readout period S1 is different from the operation of the unit pixel 12 in one horizontal scanning period just before the second readout period S2. Therefore, the potential of the N signal read out in the first readout period S1 becomes inconsistent with the potential of the N signal read out in the second readout period S2. Due to the mismatch in potential, a stepped color difference occurs in an image even if the same black level is captured, and consequently the image quality deteriorates.

On the other hand, according to the present embodiment, the preliminary selection driving is performed so that a state of the unit pixel 12 in one horizontal scanning period just before the first readout period S1 is same as a state of the unit pixel 12 in one horizontal scanning period just before the second readout period S2. More specifically, in one horizontal scanning period just before the first readout period S1, a readout drive (i.e., the preliminary selection drive) corresponding to the actual readout operation of the pixel signal is executed. Therefore, the potential mismatch of the N signal between the pixel elements included in the unit pixel 12 is eliminated, and the deterioration of the image quality is suppressed.

Figure 6:
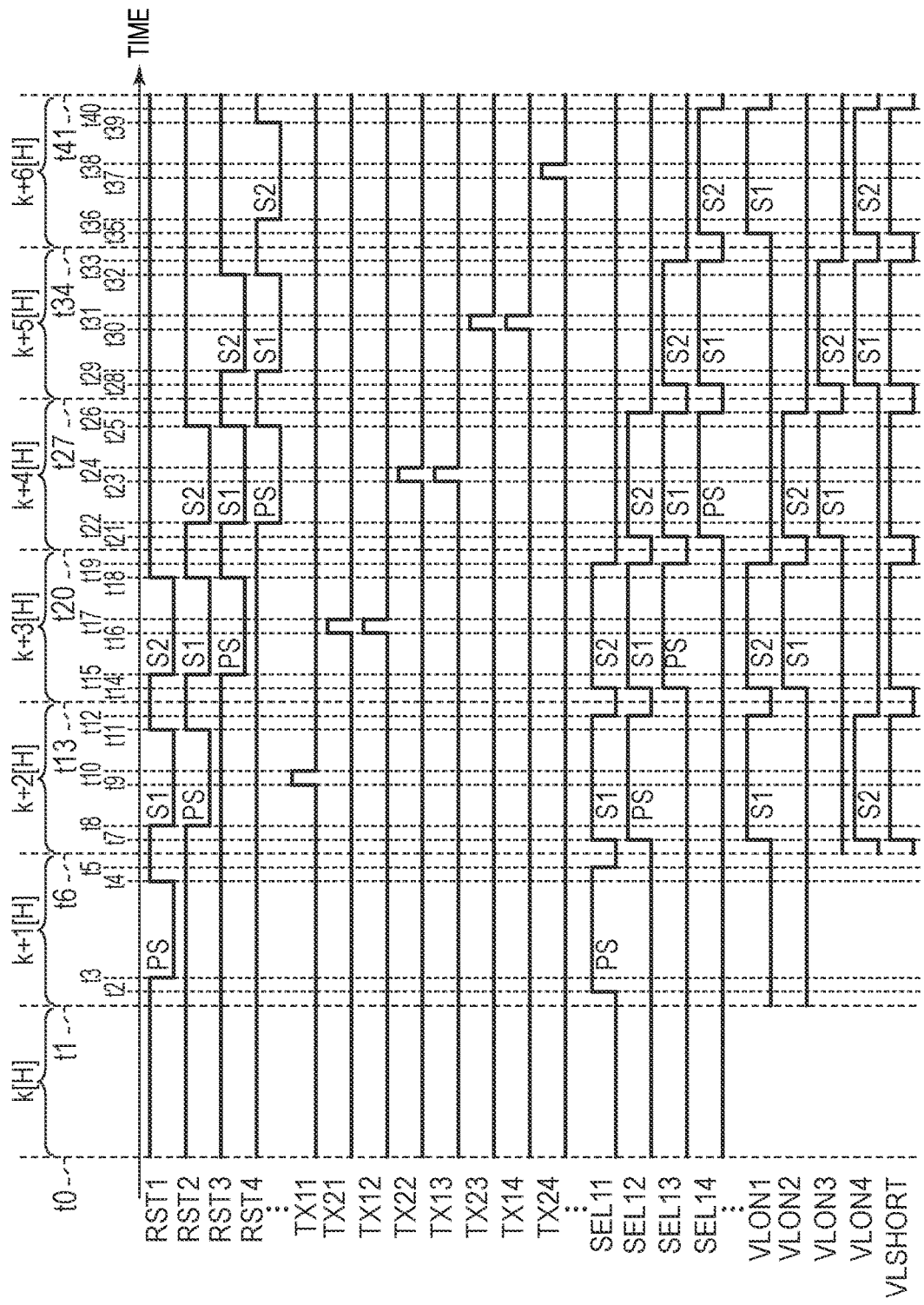
FIG. 6 is a timing diagram showing an operation example of the photoelectric conversion apparatus according to the first embodiment.

FIG. 6 is a timing diagram showing an example of the operation of the photoelectric conversion apparatus according to the present embodiment. FIG. 6 shows a timing diagram of the control signals RST1 to RST4, TX11 to TX24, SEL11 to SEL14, VLON1 to VLON4, and VLSHORT supplied from the vertical drive circuit 30 or the system controller 90 to the unit pixels 12(1, n) to 12(4, n) during the horizontal scanning periods k to k+6(k is an integer). It is assumed that each control signal is active at a high level and inactive at a low level.

In a period between time t0 and time t1, neither readout of the pixel signal nor preliminary selection driving is performed. During this period, the control signals RST1 to RST4 are maintained at a high level. Thus, the reset transistors M2 of the unit pixels 12(1, n) to 12(4, n) are kept in ON state, and the reset operation of the node FD continues. The control signals TX11 to TX24 and SEL11 to SEL14 are maintained at low levels.

A period between time t1 and t6 corresponds to the preliminary selection period PS for the unit pixel 12(1, n), and the operation of outputting a voltage corresponding to the reset voltage of the node FD in the unit pixel 12(1, n) to the output line 16n1, that is, the preliminary selection driving is executed.

At time t2, the control signal SEL11 transitions from a low level to a high level, and the selection transistor M4 of the unit pixel 12(1, n) is turned on. Thus, the unit pixel 12(1, n) is electrically connected to the output line 16n1.

At time t3, the control signal RST1 transitions from a high level to a low level, and the reset transistor M2 of the unit pixel 12(1, n) is turned off. Thus, the reset state of the node FD in the unit pixel 12(1, n) is released or lifted. After the reset transistor M2 is turned off, the potential of the node FD is lowered to a predetermined potential due to the coupling with the gate node of the reset transistor M2. The voltage of the node FD, which is statically fixed after the reset transistor M2 is turned off, becomes the reset voltage of the node FD. A signal corresponding to the reset voltage of the node FD of the unit pixel 12(1, n) is output to the output line 16n1 via the amplification transistor M3 and the selection transistor M4.

At time t4, the control signal RST1 transitions from a low level to a high level, and the reset transistor M2 of the unit pixel 12(1, n) is turned on. Thus, the reset operation of the node FD is started.

At time t5, the control signal SEL11 transitions from a high level to a low level, and the selection transistor M4 of the unit pixel 12(1, n) is turned off. Thus, the unit pixel 12(1, n) is electrically disconnected from the output line 16n1.

In the period from time t1 to time t6 (i.e., during the preliminary selection period PS), the control signal VLON1 is maintained at a low level and the connection switch M91 is maintained in OFF state. The output line 16n1 is electrically disconnected from the column circuit 52 by the connection switch M91 during the preliminary selection period PS. Therefore, the signal output to the output line 16n1 in the preliminary selection period PS is not processed by the column circuit 52.

A period between time t6 and time t13 corresponds to the first readout period S1 (i.e., the readout period of the photoelectric conversion element PD1) of the unit pixel 12(1, n) and the preliminary selection period PS of the unit pixel 12(2, n), and the readout of a signal from the photoelectric conversion element PD1 of the unit pixel 12(1, n) and the preliminary selection drive for the unit pixel 12(2, n) are respectively executed.

At time t7, the control signals SEL11 and SEL12 transition from a low level to a high level, and the selection transistors M4 of the unit pixels 12(1, n) and 12(2, n) are turned on. Thus, the unit pixel 12(1, n) is electrically connected to the output line 16n1, and the unit pixel 12(2, n) is electrically connected to the output line 16n2.

At the same time (i.e., at time t7), the control signals VLON1 and VLSHORT transition from a low level to a high level, and the connection switches M91 and M101 are turned on. Thus, the output line 16n1 is electrically connected to the two column circuits 521 and 523.

At time t8, the control signals RST1 and RST2 transition from a high level to a low level, and the reset transistors M2 of the unit pixels 12(1, n) and 12(2, n) are turned off. Thus, the reset state of the node FD in the unit pixels 12(1, n) and 12(2, n) is released or lifted, respectively. After the respective reset transistors M2 in the unit pixels 12(1, n) and 12(2, n) are turned off, the potential of each node FD is lowered to a predetermined potential by coupling with the gate node of the reset transistor M2. The voltage of each node FD, which is statically fixed after each reset transistor M2 is turned off, becomes the reset voltage of each node FD in the unit pixels 12(1, n) and 12(2, n).

A signal corresponding to the reset voltage of the node FD of the unit pixel 12(1, n) is output to the output line 16n1 via the amplification transistor M3 and the selection transistor M4. Similarly, a signal corresponding to the reset voltage of the node FD of the unit pixel 12(2, n) is output to the output line 16n2 via the amplification transistor M3 and the selection transistor M4.

The signal output from the unit pixel 12(1, n) to the output line 16n1 is processed by the column circuits 521 and 523, and read out as the N signal of the unit pixel 12(1, n). On the other hand, since the control signal VLON2 is maintained at a low level, the output line 16n2 is not electrically connected to the column circuit unit 50. Therefore, the signal output to the output line 16n2 is not processed by the column circuit unit 50.

At time t9, the control signal TX11 transitions from a low level to a high level, and the transfer transistor M11 of the unit pixel 12(1, n) is turned on. Thus, the charge accumulated in the photoelectric conversion element PD1 of the unit pixel 12(1, n) during a predetermined exposure period is transferred to the node FD of the unit pixel 12(1, n).

A signal corresponding to the amount of charge transferred from the photoelectric conversion element PD1 of the unit pixel 12(1, n) to the node FD is output to the output line 16n1 via the amplification transistor M3 and the selection transistor M4. The voltage of the output line 16n1 varies depending on the amount of charge generated in the photoelectric conversion element PD1.

At time t10, the control signal TX11 transitions from a high level to a low level, and the transfer transistor M11 of the unit pixel 12(1, n) is turned off. Thus, the transfer period of the charge from the photoelectric conversion element PD1 to the node FD in the unit pixel 12(1, n) ends. The signal output from the unit pixel 12(1, n) to the output line 16n1 is processed by the column circuits 521 and 523 after being stabilized, and is read out as the S signal of the photoelectric conversion element PD1 included in the unit pixel 12(1, n).

At time t11, the control signals RST1 and RST2 transition from a low level to a high level, and the reset transistors M2 of the unit pixels 12(1, n) and 12(2, n) are turned on. Thus, the reset operation of each node FD in the unit pixels 12(1, n) and 12(2, n) is started.

At time t12, the control signals SEL11 and SEL12 transition from a high level to a low level, and the selection transistors M4 of the unit pixel 12(1, n) for which the first readout has been performed and the unit pixel 12(2, n) for which the preliminary selection drive has been performed are turned off. Thus, the unit pixels 12(1, n) and 12(2, n) are electrically disconnected from the output lines 16n1 and 16n2. At the same time (i.e., at time t12), the control signals VLON1 and VLSHORT transition from a high level to a low level, and the connection switches M91 and M101 are turned off. Thus, the output line 16n1 is electrically disconnected from the column circuits 521 and 523.

A period between time t13 and time t20 corresponds to: the second readout period S2 (i.e., readout period of the photoelectric conversion element PD2) of the unit pixel 12(1, n); the first readout period S1 (i.e., readout period of the photoelectric conversion element PD1) of the unit pixel 12(2, n); and the preliminary selection period PS of the unit pixel 12(3, n).

At time t14, the control signals SEL11 to SEL13 transition from a low level to a high level, and the selection transistors M4 of the unit pixels 12(1, n) to 12(3, n) are turned on. Thus, the unit pixels 12(1, n) to 12(3, n) are respectively connected to the output line 16n1 to 16n3.

At the same time (i.e., at time t14), the control signals VLON1, VLON2, and VLSHORT transition from a low level to a high level, and the connection switches M91, M92, M101, and M102 are turned on. Thus, the output line 16n1 is connected to the column circuits 521 and 523, and the output line 16n2 is connected to the column circuits 522 and 524. That is, two column circuits 521 and 523 are connected to the output line 16n1, and two column circuits 522 and 524 are connected to the output line 16n2.

At time t15, the control signals RST1 to RST3 transition from a high level to a low level, and the reset transistors M2 of unit pixels 12(1, n) to 12(3, n) are turned off. Thus, the reset state of each node FD in the unit pixels 12(1, n) to 12(3, n) is released or lifted. After each reset transistor M2 is turned off, the potential of each node FD is lowered to a predetermined potential by coupling with the gate node of the reset transistor M2. The voltage of the node FD, which is statically fixed after each reset transistor M2 is turned off, becomes the reset voltage of each node FD in the unit pixels 12(1, n) to 12(3, n).

A signal corresponding to the reset voltage of the node FD of the unit pixel 12(1, n) is output to the output line 16n1 via the amplification transistor M3 and the selection transistor M4. Similarly, a signal corresponding to the reset voltage of each node FD of the unit pixels 12(2, n) and 12(3, n) is output to the output line 16n2 and the output line 16n3 via the amplification transistor M3 and the selection transistor M4, respectively.

The signal output from the unit pixel 12(1, n) to the output line 16n1 is processed by the column circuits 521 and 523 and read out as the N signal of the unit pixel 12(1, n). Similarly, the signal output from the unit pixel 12(2, n) to the output line 16n2 is processed by the column circuits 522 and 524 and read out as the N signal of the unit pixel 12(2, n). On the other hand, since the control signal VLON3 is maintained at a low level, the output line 16n3 is not electrically connected to the column circuit. Therefore, the signal output to the output line 16n3 is not processed by the column circuit unit 50.

At time t16, the control signals TX21 and TX12 transition from a low level to a high level, and the transfer transistor M12 of the unit pixel 12(1, n) and the transfer transistor M11 of the unit pixel 12(2, n) are turned on. Thus, charges accumulated in the photoelectric conversion element PD2 of the unit pixel 12(1, n) and the photoelectric conversion element PD1 of the unit pixel 12(2, n) during a predetermined exposure period are transferred to the node FD, respectively.

A signal corresponding to the amount of charge transferred from the photoelectric conversion element PD2 of the unit pixel 12(1, n) to the node FD is output to the output line 16n1 via the amplification transistor M3 and the selection transistor M4. The voltage of the output line 16n1 varies depending on the amount of charge generated in the photoelectric conversion element PD2. Similarly, a signal corresponding to the amount of charge transferred from the photoelectric conversion element PD1 of the unit pixel 12(2, n) to the node FD is output to the output line 16n2 via the amplification transistor M3 and the selection transistor M4. The voltage of the output line 16n2 varies depending on the amount of charge generated in the photoelectric conversion element PD1.

At time t17, the control signals TX21 and TX12 transition from a high level to a low level, and the transfer transistor M12 of the unit pixel 12(1, n) and the transfer transistor M11 of the unit pixel 12(2, n) are turned off. Thus, the transfer period of the charge from the photoelectric conversion element PD2 to the node FD in the unit pixel 12(1, n) and the transfer period of the charge from the photoelectric conversion element PD1 to the node FD in the unit pixel 12(2, n) end. The signal output from the unit pixel 12(1, n) to the output line 16n1 is processed by the column circuits 521 and 523 after being stabilized, and is read out as the S signal of the photoelectric conversion element PD2 included in the unit pixel 12(1, n). The signal output from the unit pixel 12(2, n) to the output line 16n2 is processed by the column circuits 522 and 524 after being stabilized, and is read out as the S signal of the photoelectric conversion element PD1 included in the unit pixel 12(2, n).

At time t18, the control signals RST1 to RST3 transition from a low level to a high level, and the reset transistors M2 of the unit pixels 12(1, n) to 12(3, n) are turned on. Thus, the reset operation of each node FD in the unit pixels 12(1, n) to 12(3, n) is started.

At time t19, the control signals SEL11 to SEL13 transition from a high level to a low level, and each selection transistor M4 of the unit pixels 12(1, n) for which the second readout has been performed, the unit pixels 12(2, n) for which the first readout has been performed, and the unit pixels 12(3, n) for which the preliminary selection drive has been performed is turned off. Thus, the unit pixels 12(1, n) to 12(3, n) are electrically disconnected from the output lines 161n to 16n3, respectively. At the same time (i.e., at time t19), the control signals VLON1, VLON2, and VLSHORT transition from a high level to a low level, and the connection switches M91, M92, M101, and M102 are turned off. Thus, the output lines 16n1 and 16n2 are electrically disconnected from the column circuit 521 to 524.

The pixel signals from the photoelectric conversion elements PD1 and PD2 in the unit pixel 12(1, n) and the photoelectric conversion element PD1 in the unit pixel 12(2, n) are read out through the above-described three horizontal scanning periods between time t1 and time t20. Thereafter, the pixel signals are read out from the other unit pixels 12 through three horizontal scanning periods between time t20 and time t41 according to the timing diagram shown in FIG. 6. That is, during the horizontal scanning period from time t20 to time t27, the S signal from the photoelectric conversion element PD2 in the unit pixel 12(2, n) and the photoelectric conversion element PD1 in the unit pixel 12(3, n) are read out, and the preliminary selection drive is executed for the unit pixel 12(4, n). Thereafter, during the horizontal scanning period from time t27 to time t34, the S signals from the photoelectric conversion element PD2 in the unit pixel 12(3, n) and the photoelectric conversion element PD1 in the unit pixel 12(4, n) are read out. Thereafter, during the horizontal scanning period from time t34 to time t41, the S signal from the photoelectric conversion element PD2 in the unit pixel 12(4, n) is read out. After the pixel signal of the fourth line is read out, the pixel array 10 is sequentially scanned from the fifth row in a unit of four lines by the same procedure as in the first to the fourth rows, so that the pixel signals are read out from the entire pixel array 10.

As described above, the reset operation of the node FD shared by the photoelectric conversion element PD1 and the photoelectric conversion element PD2 of the unit pixel 12(1, n) is performed in the respective reset periods from time t4 to time t8 and from time t11 to time t15, which span two horizontal scanning periods. The node FD during the reset period is reset to a voltage corresponding to the power supply voltage VDD through the reset transistor M2. The voltage of the node FD after the reset is released or lifted at times t8 and time t15 corresponds to a voltage level statically fixed after the reset transistor M2 of the unit pixel 12 is turned off.

However, the voltage level of the node FD after the reset is released or lifted at times t8 and time t15 may be affected by the voltage of the vertical output line 16n connected via the selection transistor M4. Specifically, the voltage level of the node FD may vary depending on the parasitic capacitance component due to coupling between the vertical output line 16n and the node FD. For example, the voltage level of the node FD when the reset state is released or lifted after the unit pixel 12 is maintained in the reset state for a certain period of time without being connected to the vertical output line 16n may be different from the voltage level of the node FD in the readout period that comes immediately after the period of the reset state being released or lifted.

According to the present embodiment, the preliminary selection period PS is provided in one horizontal scanning period just before the first readout period S1. In the preliminary selection period PS, the selection transistor M4 is turned on, and the unit pixel 12 is connected to the vertical output line 16n. Here, in the preliminary selection driving, the selection transistor M4 is turned on in the period from time t2 to time t5. The period from time t2 to time t5 in the preliminary selection driving has the same duration as the period in which the selection transistor M4 is turned on in the subsequent readout operations (i.e., time t7 to time t12, time t14 to time t19). That is, the unit pixel 12 is kept in a reset state without being connected to the vertical output line 16n for a period from time t5 to time t7 before the first readout period S1. In addition, before the second readout period S2, the unit pixel 12 is kept in a reset state without being connected to the vertical output line 16n for a period from time t12 to time t14. The duration of the time period t5 to t7 is equal to the duration of the time period t12 to t14. Therefore, in the readout operation of the photoelectric conversion elements PD1 and PD2 included in the unit pixel 12, the influence of the parasitic capacitance component between the vertical output line 16n and the node FD shared by the photoelectric conversion elements PD1 and PD2 can be made uniform. That is, according to the present embodiment, the N signal of the first readout period S1 of the unit pixel 12 is fixed at the same level as the N signal of the second readout period S2 of the unit pixel 12.

According to the first driving mode by the present embodiment, the pixel signal is read out by using two output lines out of the vertical output line 16n of each column in one horizontal scanning period. For example, during one horizontal scanning period, the first readout is executed by using the output line 16n2, and the second readout is executed by using the output line 16n1. Therefore, the output lines 16n3 and 16n4 are not used for reading the pixel signal during the same horizontal scanning period. The output line 16n3, which is not used to read the pixel signal, is used for the preliminary selection driving during the same horizontal scanning period. More specifically, by turning on the selection transistor M4 of the unit pixel 12(3, n) during the preliminary selection period PS (time t14 to time t19), the unit pixel 12(3, n) is connected to the output line 16n3, which is not used for reading the pixel signal. Then, by turning off the reset transistor M2 of the unit pixel 12(3, n) during the time period t15 to t18, the reset state of the node FD shared by the two photoelectric conversion elements PD1 and PD2 in the unit pixel 12(3, n) is released or lifted. On the other hand, since the output line 16n3 is electrically disconnected from the column circuit unit 50 during the preliminary selection period PS (times t14 to time t19), the signal output to the output line 16n3 is not processed.

According to the present embodiment, during the preliminary selection period PS, the reset state of the node FD shared by the two photoelectric conversion elements PD1 and PD2 is released or lifted and the unit pixel 12 is connected to the vertical output line 16n at the same timing as the first readout period S1 and the second readout period S2. Therefore, the mismatch between the N signal in the first readout period S1 and the N signal in the second readout period can be eliminated. That is, according to the present embodiment, when executing the readout operation of pixel signals from multiple photoelectric conversion elements, the fluctuation or variation of the reset signal at the input node shared by the multiple photoelectric conversion elements can be suppressed. Thus, the photoelectric conversion apparatus according to the present embodiment can provide an effect of suppressing the deterioration in image quality that may occur when reading out a signal input to an input node.

Second Embodiment

The photoelectric conversion apparatus according to the present embodiment and its driving method will be described with reference to FIGS. 7 to 11. The present embodiment differs from the first embodiment in that the output line connected to the pixel is switched by two selection transistors. According to the present embodiment, an output line connected to a first selection transistor is used for reading a pixel signal, and an output line connected to a second selection transistor is used for the preliminary selection driving. The operation of the photoelectric conversion apparatus according to the present embodiment may be referred to as the second driving mode. Hereinafter, the preliminary selection driving according to the present embodiment in the second driving mode will be described with a focus on the parts different from the first embodiment.

Figure 7:
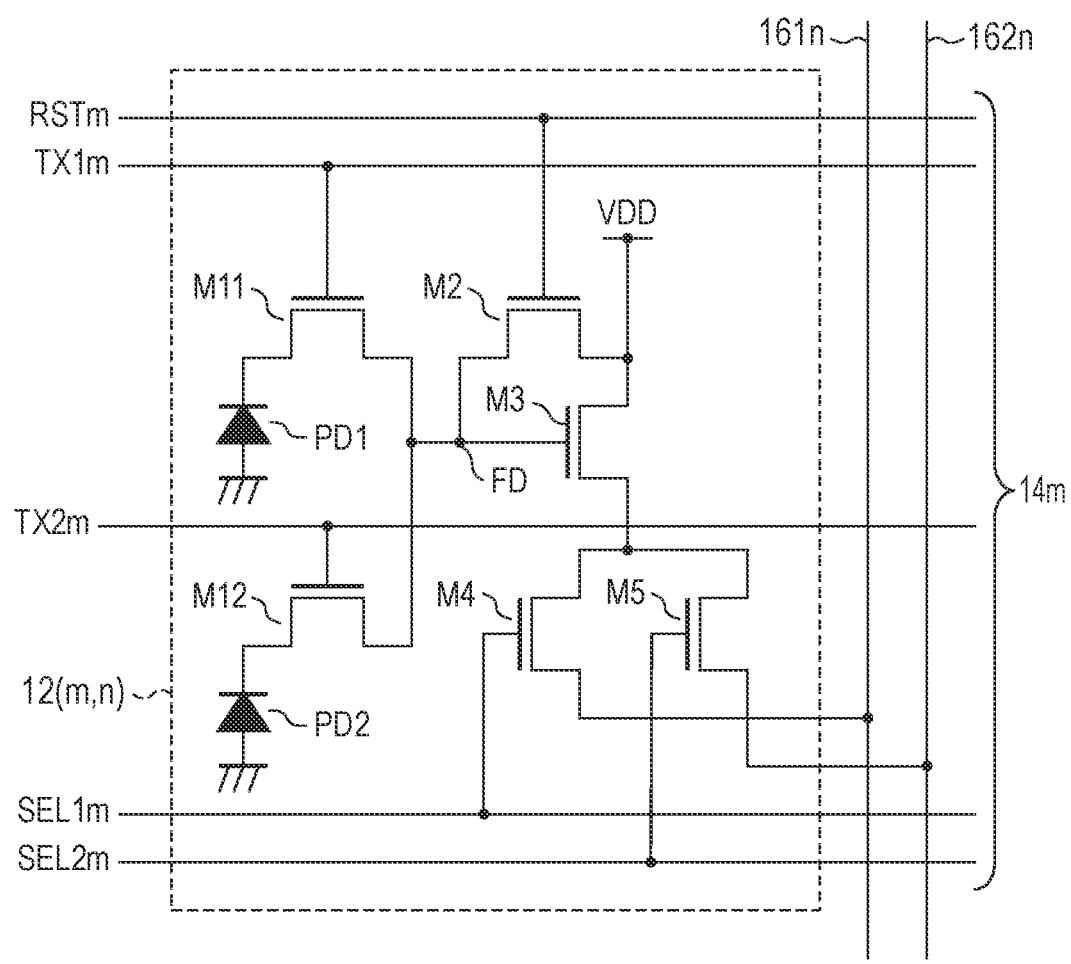
FIG. 7 is a circuit diagram showing a configuration example of a unit pixel in the second embodiment.

FIG. 7 is an equivalent circuit diagram of a unit pixel according to the present embodiment. FIG. 7 shows a unit pixel 12(m, n) arranged in the m-th row and n-th column. The circuit configuration shown in FIG. 7 differs from the first embodiment in that the source of the amplification transistor M3 is connected to the drains of the two selection transistors M4 and M5. The source of the selection transistor M4 is connected to the output line 161n included in the vertical output line 16n, and the source of the selection transistor M5 is connected to the output line 162n included in the vertical output line 16n.

In the present embodiment, the control line 14m of each row includes four signal lines connected to the transfer transistors M11, M12, the amplification transistor M3, and the selection transistor M4, respectively, and a signal line connected to the gate of the selection transistor M5. A control signal SEL2m is supplied from the vertical drive circuit 30 to the gate of the selection transistor M5 of the unit pixel 12 in the m-th row.

Figure 8:
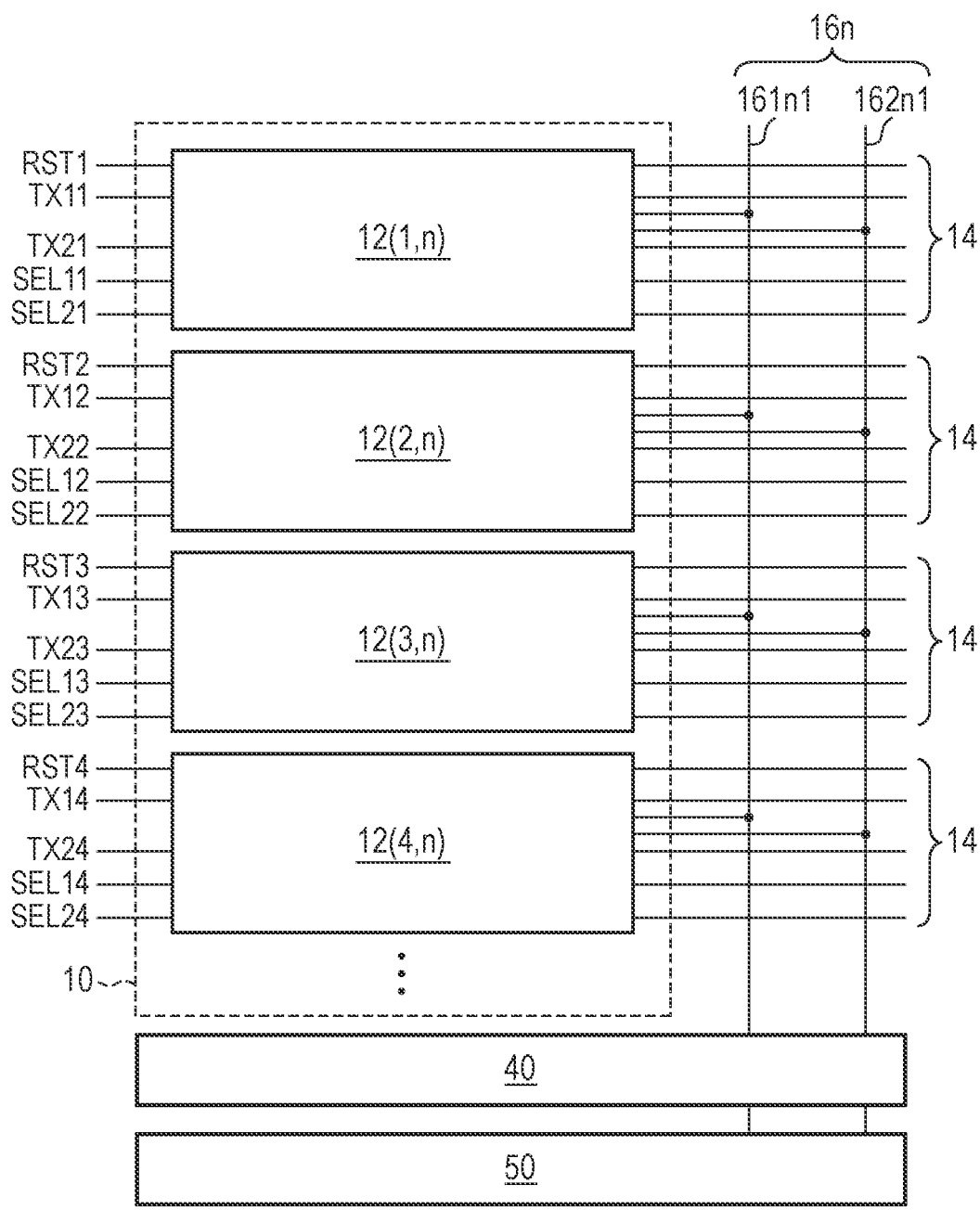
FIG. 8 is a schematic diagram showing a connection example of a unit pixel in the second embodiment.

FIG. 8 is a schematic diagram showing a connection example of the unit pixel according to the present embodiment. As shown in FIG. 8, in the present embodiment, the vertical output line 16n of each column includes two output lines 161n1, 162n1. The number of output lines 161n and 162n in each column according to the present embodiment is not limited to the connection example shown in FIG. 8, and may include three or more output lines.

Figure 9:
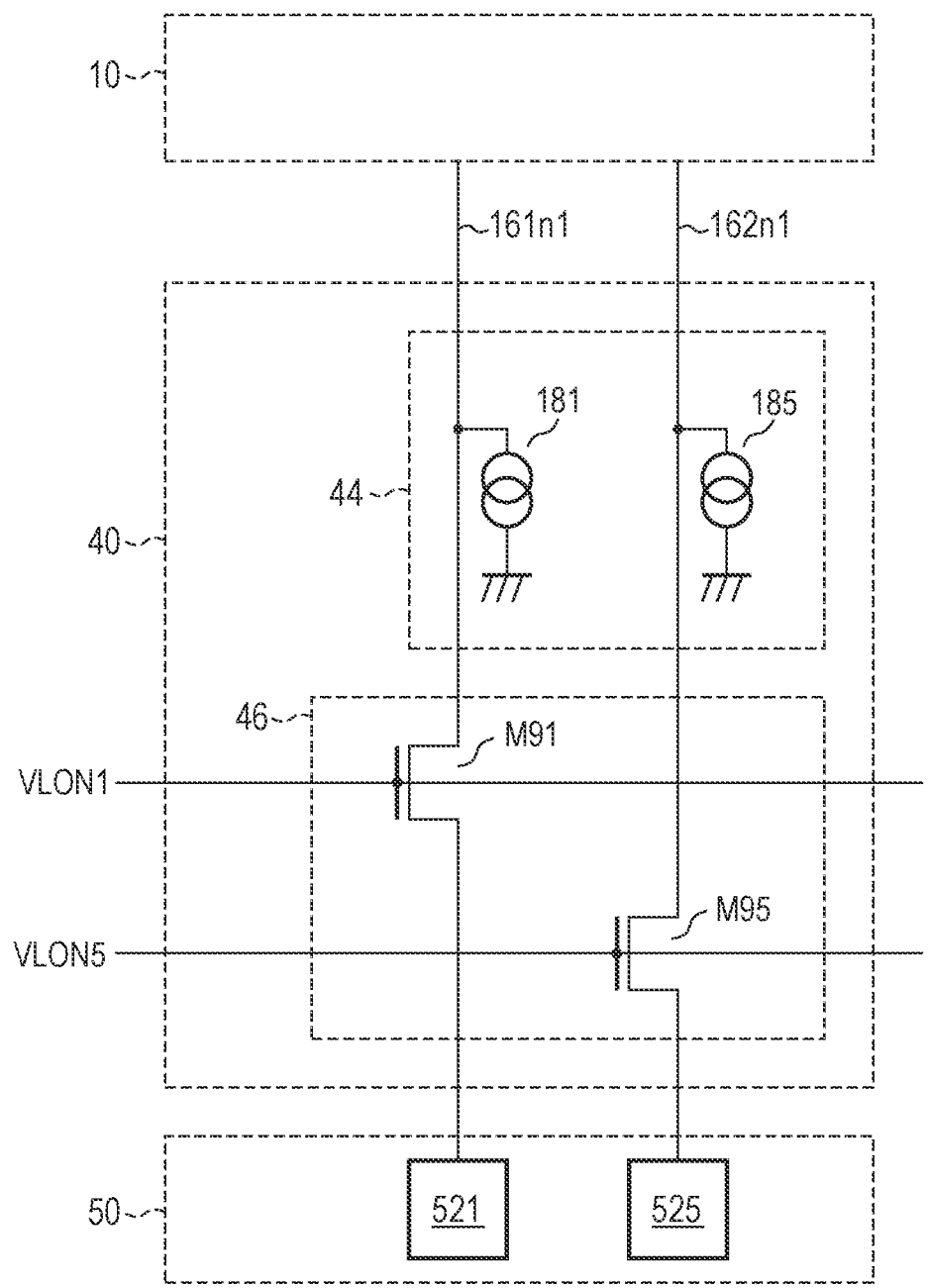
FIG. 9 is a circuit diagram of a photoelectric conversion apparatus according to the second embodiment.

FIG. 9 is a circuit diagram of the photoelectric conversion apparatus according to the present embodiment. FIG. 9 shows only a circuit configuration corresponding to the n-th vertical output lines 161n1 and 162n1.

The output line drive circuit 40 according to the present embodiment includes the current source circuit 44 and the connection circuit 46. The current source circuit 44 includes the current source 181 and a current source 185 connected to the output lines 161n1 and 162n1, respectively. The connection circuit 46 includes two connection switches M91 and M95 corresponding to the output lines 161n1 and 162n1. The control signal VLON1 and a control signal VLON5 are supplied from the system controller 90 to the gate nodes of the connection switches M91 and M95, respectively.

The column circuit unit 50 according to the present embodiment includes the column circuit 521 and a column circuit 525 corresponding to the output lines 161n1 and 162n1, respectively. The column circuit 521 is connected to the pixel array 10 via the output line 161n1 and the connection switch M91. The column circuit 525 is connected to the pixel array 10 via the output line 162n1 and the connection switch M95. In the present embodiment, the connection switches M91 and M95 do not necessarily need to be arranged, and the portions corresponding to the connection switches M91 and M95 may always be in a conductive state. The column circuit 525 does not necessarily need not be disposed, and the signal output to the output line 162n1 does not necessarily need to be processed by the column circuit unit 50. That is, the output line 162n1 may be used only for the preliminary selection driving.

Figure 10:
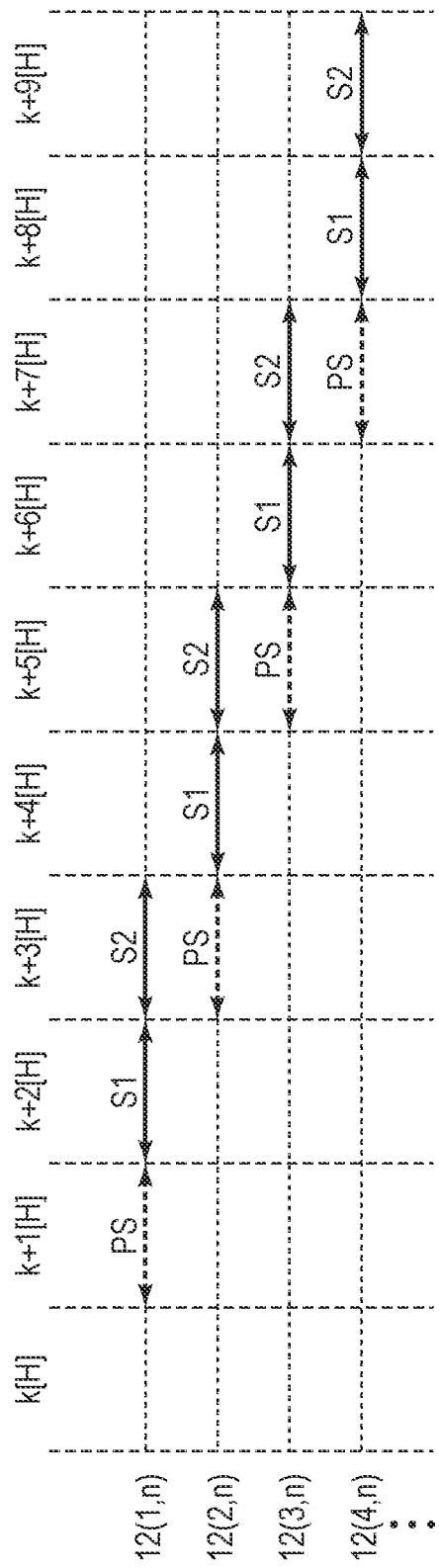
FIG. 10 is a sequence diagram showing the operation of the photoelectric conversion apparatus according to the second embodiment.

FIG. 10 is a sequence diagram showing the operation of the photoelectric conversion apparatus according to the present embodiment. In the present embodiment, the second driving mode is applied in which all output lines included in the vertical output line 161n are used for reading out the pixel signal during one horizontal scanning period.

FIG. 10 shows an example of the operation when reading out pixel signals of the unit pixels 12(1, n) to 12(4, n) during the horizontal scanning periods k to k+9 (k is an integer). During the horizontal scanning period k, pixel signals are not read out from the unit pixels 12(1, n) to 12(4, n).

During the horizontal scanning period k+1, the preliminary selection driving is performed on the unit pixel 12(1, n). In the horizontal scanning period k+2, a pixel signal from the photoelectric conversion element PD1 of the unit pixel 12(1, n) is read out.

In the horizontal scanning period k+3, a pixel signal from the photoelectric conversion element PD2 of the unit pixel 12(1, n) is read out, and the preliminary selection driving is performed for the unit pixel 12(2, n). In the horizontal scanning period k+4, a pixel signal from the photoelectric conversion element PD1 of the unit pixel 12(2, n) is read out.

In the horizontal scanning period k+5, a pixel signal from the photoelectric conversion element PD2 of the unit pixel 12(2, n) is read out, and the preliminary selection driving is performed for the unit pixel 12(3, n). In the horizontal scanning period k+6, a pixel signal from the photoelectric conversion element PD1 of the unit pixel 12(3, n) is read out.

In the horizontal scanning period k+7, a pixel signal from the photoelectric conversion element PD2 of the unit pixel 12(3, n) is read out, and the preliminary selection driving is performed for the unit pixel 12(4, n). In the horizontal scanning periods k+8 and k+9, pixel signals from the photoelectric conversion elements PD1 and PD2 of the unit pixel 12(4, n) are read out, respectively.

Figure 11:
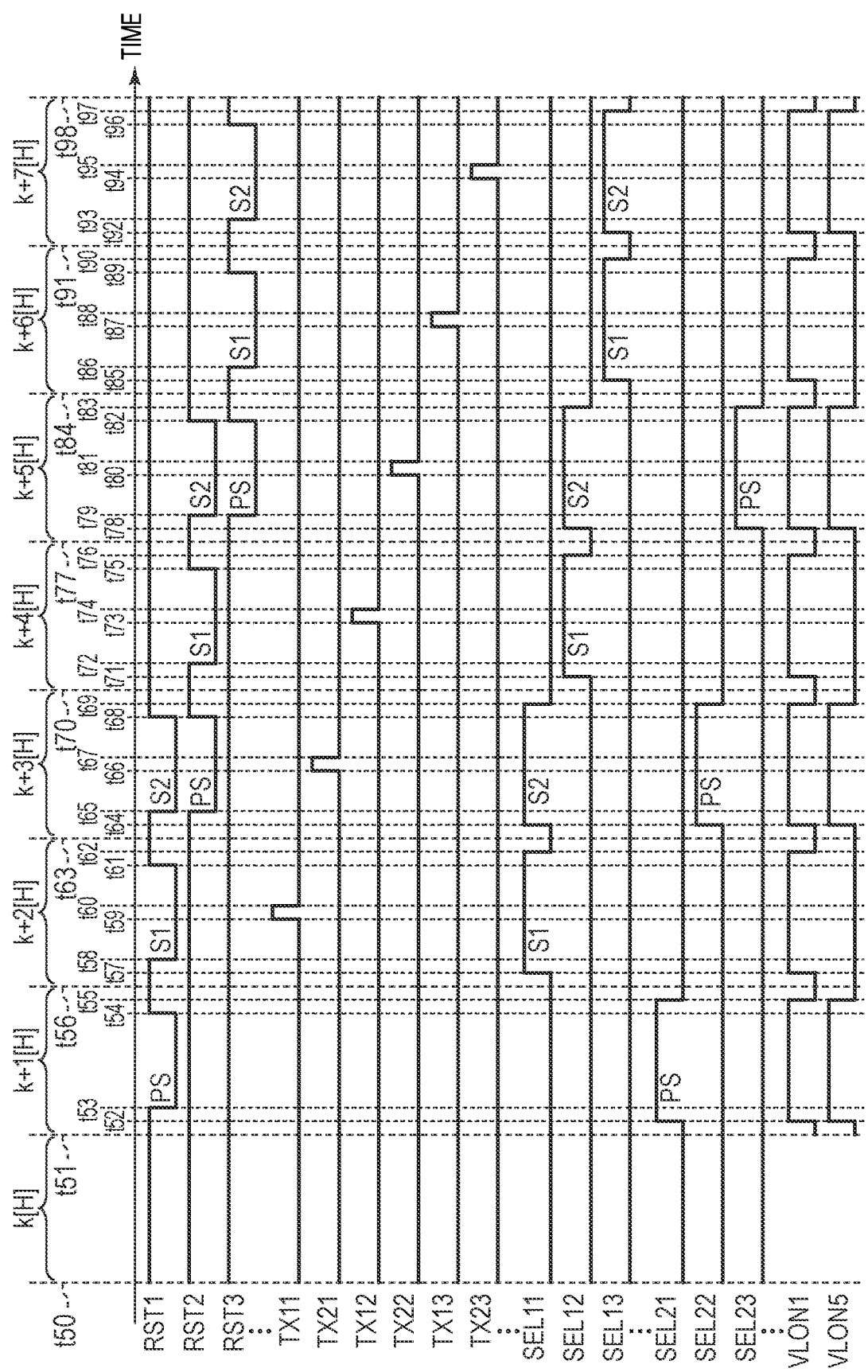
FIG. 11 is a timing diagram showing an operation example of the photoelectric conversion apparatus according to the second embodiment.

FIG. 11 is a timing diagram showing an example of the operation of the photoelectric conversion apparatus according to the present embodiment. FIG. 11 shows a timing diagram of the control signals RST1 to RST3, TX11 to TX23, SEL11 to SEL23, and the control signals VLON1 and VLON5 supplied from the vertical drive circuit 30 or the system controller 90 to the unit pixels 12(1, n) to 12(3, n) during the horizontal scanning periods k to k+7.

In the period between time t50 and time t51, no pixel signal is read out and the preliminary selection driving is not performed. During this period, the control signals RST1 to RST3 are maintained at a high level. Thus, the reset transistors M2 of the unit pixels 12(1, n) to 12(3, n) are kept in ON state, and the reset operation of the node FD continues. The control signals TX11 to TX23 and SEL11 to SEL23 are maintained at low levels.

The time period between time t51 and time t56 corresponds to the preliminary selection period PS for the unit pixel 12(1, n), and the preliminary selection driving is executed.

At time t52, the control signal SEL21 transitions from a low level to a high level, and the selection transistor M5 of the unit pixel 12(1, n) is turned on. Thus, the unit pixel 12(1, n) is connected to the output line 162n1. At the same time (i.e., at time t52), the control signals VLON1 and VLON5 transition from a low level to a high level, and the connection switches M91 and M95 are turned on. Thus, the output line 161n1 is electrically connected to the column circuit 521, and the output line 162n1 is electrically connected to the column circuit 525.

At time t53, the control signal RST1 transitions from a high level to a low level, and the reset transistor M2 of the unit pixel 12(1, n) is turned off. Thereby, the reset state of the node FD in the unit pixel 12(1, n) is released or lifted, and the potential of the node FD is lowered to a predetermined potential by coupling with the gate node of the reset transistor M2. A signal corresponding to the reset voltage of the node FD of the unit pixel 12(1, n) is output to the output line 162n1 via the amplification transistor M3 and the selection transistor M5.

At time t54, the control signal RST1 transitions from a low level to a high level, and the reset transistor M2 of the unit pixel 12(1, n) is turned on. Thus, the reset operation of the node FD is started.

At time t55, the control signal SEL21 transitions from a high level to a low level, and the selection transistor M5 of the unit pixel 12(1, n) is turned off. Thus, the unit pixel 12(1, n) is electrically disconnected from the output line 162n1. At the same time (i.e., at time t55), the control signals VLON1 and VLON5 transition from a high level to a low level, and the connection switches M91 and M95 are turned off. Thus, the output lines 161n1 and 162n1 are electrically disconnected from the column circuits 521 and 525, respectively.

In the period between time t51 and time t56 (i.e., the preliminary selection period PS), the control signals VLON1 and VLON5 are maintained at high levels, and the connection switches M91 and M95 are maintained in ON state. The output line 161n1 is electrically connected to the column circuit 521 via the connection switch M91 in the preliminary selection period PS, and the output line 162n1 is electrically connected to the column circuit 525. The output lines 161n1 and 162n1 may be electrically disconnected from the column circuits 521 and 525, respectively, by maintaining the control signals VLON1 and VLON5 at low levels during the preliminary selection period PS.

The period between time t56 and time t63 corresponds to the first readout period S1 (i.e., readout period of the photoelectric conversion element PD1) of the unit pixel 12(1, n), and signals are read out from the photoelectric conversion element PD1 of the unit pixel 12(1, n).

At time t57, the control signal SEL11 transitions from a low level to a high level, and the selection transistor M4 of the unit pixel 12(1, n) is turned on. Thus, the unit pixel 12(1, n) is connected to the output line 161n1. At the same time (i.e., at time t57), the control signal VLON1 transitions from a low level to a high level, and the connection switch M91 is turned on. Thus, the output line 161n1 is electrically connected to the column circuit 521.

At time t58, the control signal RST1 transitions from a high level to a low level, and the reset transistor M2 of the unit pixel 12(1, n) is turned off. Thus, the reset state of the node FD in the unit pixel 12(1, n) is released or lifted. After the reset transistor M2 in the unit pixel 12(1, n) is turned off, the potential of each node FD drops to a predetermined potential. A signal corresponding to the reset voltage of the node FD of the unit pixel 12(1, n) is output to the output line 161n1 via the amplification transistor M3 and the selection transistor M4. The signal output from the unit pixel 12(1, n)

to the output line 161n1 is processed by the column circuit 521 and read out as the N signal of the unit pixel 12(1, n).

At the following time t59, the control signal TX11 transitions from a low level to a high level, and the transfer transistor M11 of the unit pixel 12(1, n) is turned on. Thus, the charge accumulated in the photoelectric conversion element PD1 of the unit pixel 12(1, n) is transferred to the node FD of the unit pixel 12(1, n). A signal corresponding to the amount of charge transferred from the photoelectric conversion element PD1 to the node FD is output to the output line 161n1 via the amplification transistor M3 and the selection transistor M4. The voltage of the output line 161n1 varies depending on the amount of charge generated in the photoelectric conversion element PD1.

At time t60, the control signal TX11 transitions from a high level to a low level, and the transfer transistor M11 of the unit pixel 12(1, n) is turned off. Thus, the transfer period of the charge from the photoelectric conversion element PD1 to the node FD in the unit pixel 12(1, n) ends. The signal output from the unit pixel 12(1, n) to the output line 161n1 is processed by the column circuit 521 after being stabilized, and is read out as the S signal of the photoelectric conversion element PD1 in the unit pixel 12(1, n).

At time t61, the control signal RST1 transitions from a low level to a high level, and the reset transistor M2 of the unit pixel 12(1, n) is turned on. Thus, the reset operation of each node FD in the unit pixel 12(1, n) is started.

At time t62, the control signal SEL11 transitions from a high level to a low level, and the selection transistor M4 of the unit pixel 12(1, n) for which the first readout has been performed is turned off. Thus, the unit pixel 12(1, n) is electrically disconnected from the output line 161n1. At the same time (i.e., at time t62), the control signal VLON1 transitions from a high level to a low level, and the connection switch M91 is turned off. Thus, the output line 161n1 is electrically disconnected from the column circuit 521.

The time period between time t63 and time t70 corresponds to the second readout period S2 (i.e., readout period of the photoelectric conversion element PD2) of the unit pixel 12(1, n) and the preliminary selection period PS of the unit pixel 12(2, n).

At time t64, the control signals SEL11 and SEL22 transition from a low level to a high level, and the selection transistor M4 of the unit pixel 12(1, n) and the selection transistor M5 of the unit pixel 12(2, n) are turned on. Thus, the unit pixel 12(1, n) is electrically connected to the output line 161n1, and the unit pixel 12(2, n) is electrically connected to the output line 162n1. At the same time (i.e., at time t64), the control signals VLON1 and VLON5 transition from a low level to a high level, and the connection switches M91 and M95 are turned on. Thus, the output line 161n1 is electrically connected to the column circuit 521, and the output line 162n1 is electrically connected to the column circuit 525.

At time t65, the control signals RST1 and RST2 transition from a high level to a low level, and the reset transistors M2 of unit pixels 12(1, n) and 12(2, n) are turned off. Thus, the reset state of each node FD in the unit pixels 12(1, n) and 12(2, n) is released or lifted. After each reset transistor M2 is turned off, the potential of each node FD drops to a predetermined potential. The voltage of the node FD, which is statically fixed after each reset transistor M2 is turned off, becomes the reset voltage of each node FD in the unit pixels 12(1, n) and 12(2, n). The signal corresponding to the reset voltage of the node FD of the unit pixel 12(1, n) is output to the output line 161n1 via the amplification transistor M3 and the selection transistor M4. Similarly, a signal corresponding to the reset voltage of the node FD of the unit pixel 12(2, n) is output to the output line 162n1 via the amplification transistor M3 and the selection transistor M5. The signal output from the unit pixel 12(1, n) to the output line 161n1 is processed by the column circuit 521 and read out as the N signal of the unit pixel 12(1, n). The signal output from the unit pixel 12(2, n) to the output line 162n1 may be processed by the column circuit 525.

At time t66, the control signal TX21 transitions from a low level to a high level, and the transfer transistor M12 of the unit pixel 12(1, n) is turned on. Thus, the charge accumulated in the photoelectric conversion element PD2 of the unit pixel 12(1, n) is transferred to the node FD of the unit pixel 12(1, n). A signal corresponding to the amount of charge transferred from the photoelectric conversion element PD2 of the unit pixel 12(1, n) to the node FD is output to the output line 161n1 via the amplification transistor M3 and the selection transistor M4. The voltage of the output line 161n1 varies depending on the amount of charge generated in the photoelectric conversion element PD2.

At time t67, the control signal TX21 transitions from a high level to a low level, and the transfer transistor M12 of the unit pixel 12(1, n) is turned off. Thus, the transfer period of the charge from the photoelectric conversion element PD2 to the node FD in the unit pixel 12(1, n) ends. The signal output from the unit pixel 12(1, n) to the output line 161n1 is processed by the column circuit 521 after being stabilized, and is read out as the S signal of the photoelectric conversion element PD2 in the unit pixel 12(1, n).

At time t68, the control signals RST1 and RST2 transition from a low level to a high level, and the reset transistors M2 of unit pixels 12(1, n) and 12(2, n) are turned on. Thus, the reset operation of each node FD in the unit pixels 12(1, n) and 12(2, n) is started.

At time t69, the control signals SEL11 and SEL22 transition from a high level to a low level, and the selection transistor M4 of the unit pixel 12(1, n) for which the second readout has been performed and the selection transistor M5 of the unit pixel 12(2, n) for which the preliminary selection drive has been performed are turned off, respectively. Thus, the unit pixels 12(1, n) and 12(2, n) are electrically disconnected from the output lines 161n1 and 162n1, respectively. At the same time (i.e., at time t69), the control signals VLON1 and VLON5 transition from a high level to a low level, and the connection switches M91 and M95 are turned off. Thus, the output lines 161n1 and 162n1 are electrically disconnected from the column circuits 521 and 525.

The pixel signals from the photoelectric conversion elements PD1 and PD2 in the unit pixel 12(1, n) are read out through three horizontal scanning periods from time t51 to time t70 described above. Thereafter, pixel signals are read out from the other unit pixels 12(2, n) and 12(3, n), respectively, through the four horizontal scanning periods from time t70 to time t98 according to the timing diagram shown in FIG. 11. That is, during the horizontal scanning period between time t70 and time t77, the S signal from the photoelectric conversion element PD1 in the unit pixel 12(2, n) is read out. Thereafter, during the horizontal scanning period between time t77 and time t84, the S signal from the photoelectric conversion element PD2 in the unit pixel 12(2, n) is read out, and the preliminary selection driving is executed for the unit pixel 12(3, n). Thereafter, during each of the horizontal scanning period between time t84 and time t91 and the horizontal scanning period between time t91 and time t98, the S signals from the photoelectric conversion elements PD1 and PD2 in the unit pixel 12(3, n) are read out. After the pixel signals of the third row are read out, the pixel array 10 is sequentially scanned from the fourth row in a unit of three lines by the same procedure as in the first to the third rows, so that the pixel signals are read out from the entire pixel array 10.

As described above, if the photoelectric conversion apparatus is driven in the second driving mode according to the present embodiment, all the output lines 161n included in the vertical output lines 16n are connected to the unit pixel 12n in each horizontal scanning period. The pixel signal from the unit pixel 12n is read out by the column circuit unit 50 via all the output lines 161n. That is, if the photoelectric conversion apparatus is driven in the second driving mode, the preliminary selection driving cannot be performed using the output line 161n that is not used for reading out the pixel signal.

The photoelectric conversion apparatus according to the present embodiment includes the second selection transistor M5 for the preliminary selection driving. The output line 162n1 connected to the second selection transistor M5 is not used for reading out pixel signals. Accordingly, even if the photoelectric conversion apparatus is driven in the second driving mode according to the present embodiment, the variation or fluctuation of the reset signal at the input node (node FD) shared by multiple photoelectric conversion elements (or photoelectric conversion units) can be reduced. Thus, the photoelectric conversion apparatus according to the present embodiment can suppress deterioration in image quality that may occur when reading out signals input to the input node.

Third Embodiment

The device according to the third embodiment of the present disclosure will be described with reference to FIG. 12. FIG. 12 is a block diagram showing an example of the configuration of an imaging system 7 according to the present embodiment.

The photoelectric conversion apparatus according to the above embodiments is applicable to a variety of devices. The above devices include digital still cameras, digital camcorders, camera heads, copiers, facsimile machines, mobile phones, on-board cameras, observation satellites, and surveillance cameras. FIG. 12 shows a block diagram of a digital still camera as an example of the devices.

The device shown in FIG. 12 includes a barrier 706, a lens 702, an aperture 704, an imaging device (an example of the photoelectric conversion apparatus) 700, a signal processing unit 708, a timing generation unit 720, a general control/operation unit (or control device) 718, a memory unit (or storage device) 710, a storage medium control I/F unit 716, a storage medium 714, and an external I/F unit 712. At least one of the barrier 706, the lens 702, and the aperture 704 is an optical apparatus corresponding to the devices. The barrier 706 protects the lens 702, and the lens 702 forms an optical image of a subject on the imaging device 700. The aperture 704 varies the amount of light passing through the lens 702. The imaging device 700 is configured as described above, and converts an optical image formed by the lens 702 into image data (or image signals). Here, it is assumed that an AD (analog-to-digital) converter is arranged on a semiconductor substrate of the imaging device 700. The signal processing unit 708 compresses various corrections and data to the imaging data output from the imaging device 700. That is, the signal processing unit 708 can be a signal processing device for processing the image signal output from the photoelectric conversion apparatus.

The timing generation unit 720 outputs various timing signals to the imaging device 700 and the signal processing unit 708. The general control/operation unit 718 totally controls the digital still camera, and the memory unit 710 temporarily stores image data. The storage medium control OF unit 716 is an interface for storing or reading image data in the storage medium 714, and the storage medium 714 is a removable recording medium such as a semiconductor memory for recording or reading image data. The external OF unit 712 is an interface for communicating with an external computer or the like. A timing signal or the like may be input from the outside of the device. Further, the imaging system 7 may include a display apparatus (monitor, electronic viewfinder, etc.) for displaying information obtained by the photoelectric conversion apparatus. The device includes at least a photoelectric conversion apparatus. In addition, the device includes at least any of machinery or a device operating based on information obtained by optical apparatus, control apparatus, processing apparatus, display apparatus, storage apparatus, and photoelectric conversion apparatus. The machinery or the device is a movable unit (for example, a robot arm) which receives a signal and operates based on the signal that is generated by the photoelectric conversion apparatus.

In the present embodiment, the imaging device 700 and the AD conversion unit are provided on different semiconductor substrates, but the imaging device 700 and the AD conversion unit may be formed on the same semiconductor substrate. The imaging device 700 and the signal processing unit 708 may be formed on the same semiconductor substrate.

Each pixel may also include multiple photoelectric conversion units. The signal processing unit 708 may be configured to process a pixel signal based on charge generated in the first photoelectric conversion unit and a pixel signal based on charge generated in the second photoelectric conversion unit to acquire information of distance from the imaging device 700 to the subject.

Fourth Embodiment

Figure 13A:
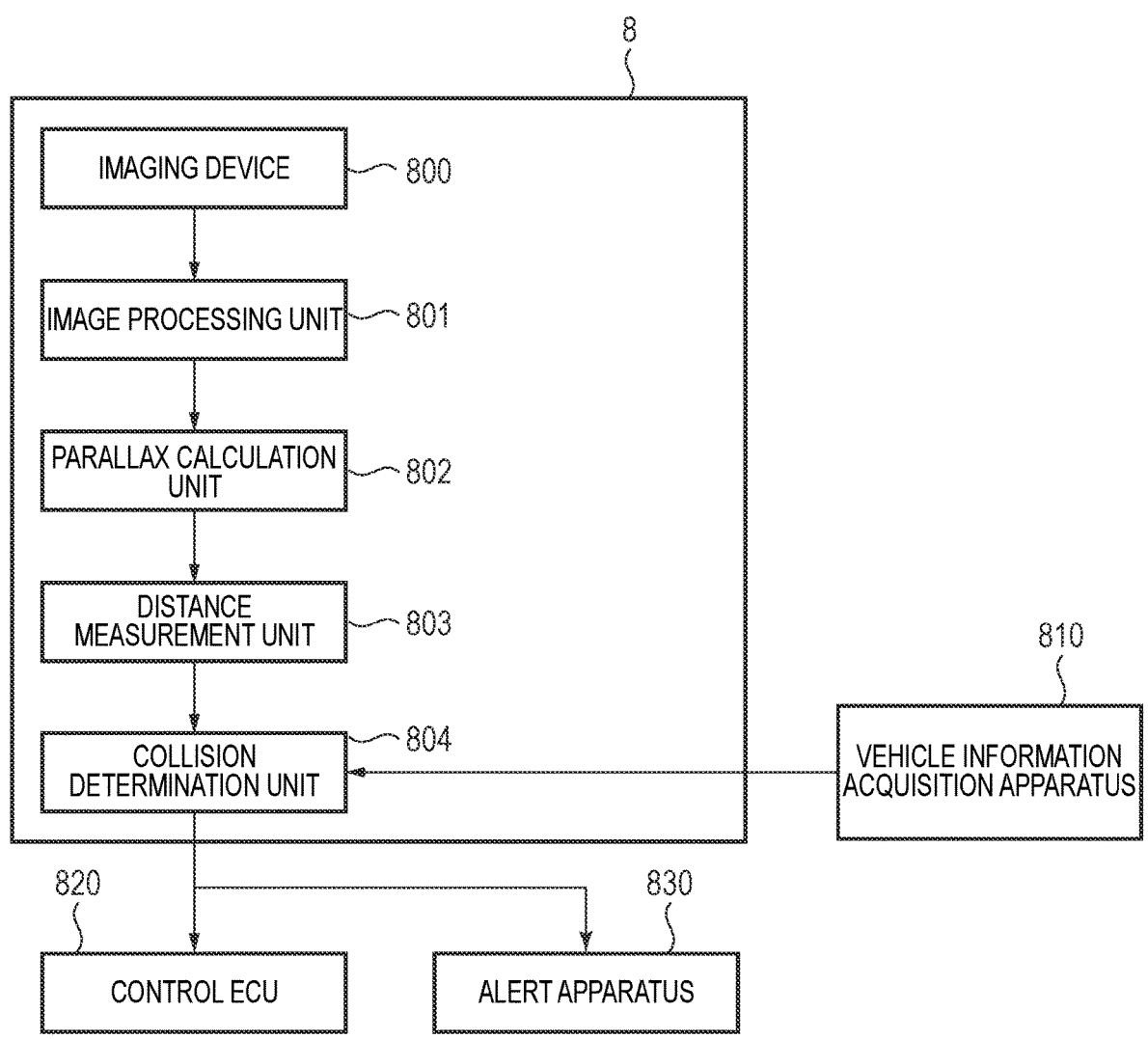
FIG. 13A is a block diagram of a device related to an on-vehicle camera according to the fourth embodiment.
Figure 13B:
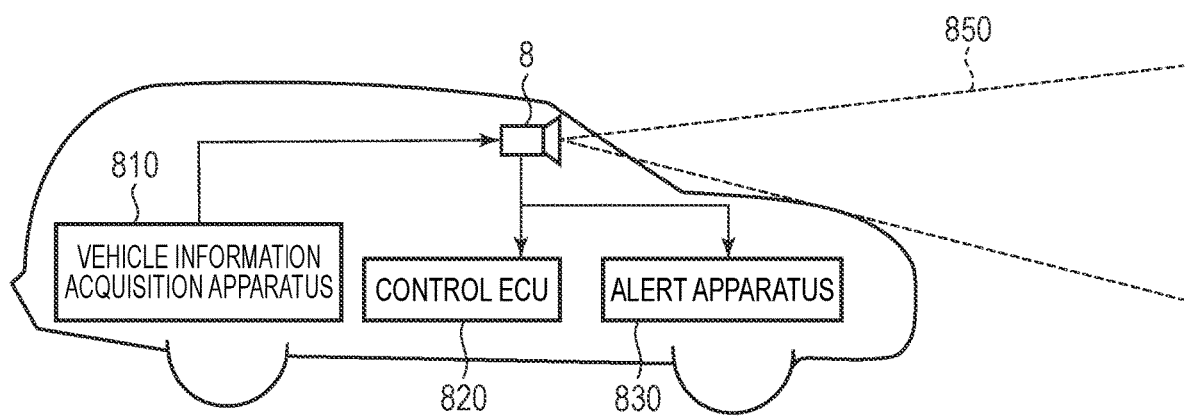
FIG. 13B is a block diagram of a device related to an on-vehicle camera according to the fourth embodiment.

FIGS. 13A and 13B are block diagrams of a device associated with an on-vehicle camera according to the present embodiment. A device 8 is an example of an imaging system according to the present embodiment and has an imaging device (an example of the photoelectric conversion apparatus) 800 according to the above-described embodiments. The device 8 includes an image processing unit 801 for performing image processing on image data acquired by the imaging device 800, and a parallax calculation unit 802 for calculating parallax (or a phase difference of a parallax image) from image data acquired from the device 8. The device 8 includes a distance measurement unit 803 for calculating a distance to the object based on the calculated parallax, and a collision determination unit 804 for determining whether there is a possibility of collision based on the calculated distance. Here, the image processing unit 801 may be a signal processing device for processing image signals output from the photoelectric conversion apparatus. The parallax calculation unit 802 and the distance measurement unit 803 are examples of distance information acquisition means for acquiring distance information to an object. That is, the distance information is information on parallax, defocus amount, distance to the object, and the like. The collision determination unit 804 may determine the possibility of collision using any of the distance information. The distance information acquisition means may be realized by a dedicated hardware or by a software module. It may be realized by an FPGA (Field Programmable Gate Array), an ASIC (Application Specific Integrated Circuit), or a combination thereof.

The device 8 is connected to a vehicle information acquisition apparatus 810 that can acquire vehicle information such as vehicle speed, yaw rate and steering angle. The device 8 is connected to a control ECU820 that is a control device for outputting a control signal for generating a braking force to a vehicle based on a determination result made by the collision determination unit 804. The device 8 is also connected to an alert apparatus 830 for giving an alarm to a driver based on the determination result made by the collision determination unit 804. For example, if there is a high possibility of collision according to the collision determination unit 804, the control ECU820 applies the brake, eases up on or release the accelerator, and suppresses the engine output to avoid the collision and perform vehicle control to reduce the damage. The alert apparatus 830 alerts a user by sounding an alarm such as a sound, displaying alarm information on a screen such as a car navigation system, or applying vibration to a seatbelt or the steering. The device 8 functions as control means for controlling the operation of controlling the vehicle as described above.

In the present embodiment, the periphery of the vehicle, for example, front or rear thereof, is imaged by using the device 8. FIG. 13B shows a device for imaging the front (imaging range 850) of the vehicle. The vehicle information acquisition apparatus 810 as imaging control means sends an instruction to the device 8 or to the imaging device 800 to perform the operation described in the above embodiments. With such a configuration, the accuracy of distance measurement can be improved.

Although the example of controlling the vehicle so as not to collide with another vehicle has been described above, the control according to the present disclosure is also applicable for following another vehicle and driving automatically, and for not protruding from the lane. Further, the application of the device is not limited to vehicles such as automobiles, but the device may be also applied to other mobile bodies (mobile apparatuses) such as, for example, ships, aircraft, satellites, industrial robots, and civil robots. In addition, the device may be also applied not only to mobile objects, but also to equipment using the object recognition or the biological recognition, such as intelligent transport systems (ITS), monitoring systems, etc.

Other Embodiments

The present disclosure is not limited to the above embodiment, and various modifications are possible. For example, an example in which some of the configurations of any of the embodiments are added to other embodiments or an example in which some of the configurations of any of the embodiments are replaced with some of the configurations of other embodiments is also an embodiment of the present disclosure.

Embodiment(s) of the present disclosure can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present disclosure has been described with reference to exemplary embodiments, it is to be understood that the disclosure is not limited to the disclosed exemplary embodiments. The scope of the following claims is to be accorded the broadest interpretation to encompass all such modifications and equivalent structures and functions.

This application claims the benefit of Japanese Patent Application No. 2022-116303, filed Jul. 21, 2022, which is hereby incorporated by reference herein in its entirety.

What is claimed is:

1. A photoelectric conversion device comprising:
a plurality of pixels arranged across multiple rows and multiple columns, each pixel including a plurality of photoelectric conversion elements generating charge, an amplification transistor having an input node for receiving a signal that is based on the charge generated in the plurality of photoelectric conversion elements, and a reset transistor supplying a reset voltage to the input node; and
a plurality of output lines disposed for the pixels that are arranged along the columns,
wherein in a first period, the input node is electrically disconnected from the plurality of photoelectric conversion elements, and a signal based on the reset voltage at the input node is output from a pixel arranged in a first row of the multiple rows to one of the output lines,
wherein in a second period, a signal based on the reset voltage at the input node and a signal based on the charge transferred to the input node are output from the pixel arranged in the first row to one of the output lines,
wherein in a third period, a signal based on the charge transferred to the input node is output from a pixel arranged in a second row of the multiple rows to one of the output lines, the second row being different from the first row,
wherein in a fourth period, a signal based on the charge transferred to the input node is output from a pixel arranged in a third row of the multiple rows to one of the output lines, the third row being different from the first and second rows, and
wherein the first period is a period prior to the second period, and is a period between the third and fourth periods.

2. The photoelectric conversion device according to claim 1, wherein the first and second periods are a sequence of periods.

3. The photoelectric conversion device according to claim 1,
wherein the pixel includes a plurality of transfer transistors that transfer charge generated in the plurality of photoelectric conversion elements to the input node, and
wherein the plurality of transfer transistors is turned off in the first period.

4. The photoelectric conversion device according to claim 1,
wherein the plurality of photoelectric conversion elements includes first and second photoelectric conversion elements;
wherein the second period includes:
a first readout period in which a signal based on charge generated in the first photoelectric conversion element and a signal based on the reset voltage are output to one of the output lines; and
a second readout period in which a signal based on charge generated in the second photoelectric conversion element and a signal based on the reset voltage are output to one of the output lines.

5. The photoelectric conversion device according to claim 4, wherein the first period, the first readout period, and the second readout period are a sequence of three horizontal scanning periods.

6. The photoelectric conversion device according to claim 5, wherein the signal is not output from the pixel to one of the output lines in a period prior to the first period by at least one horizontal scanning period.

7. The photoelectric conversion device according to claim 1,
wherein the plurality of output lines includes first and second output lines that are arranged in a common column,
wherein the plurality of pixels includes first and second pixels,
wherein the first pixel outputs the signal to the first output line in the first and second periods, and
wherein the second pixel outputs the signal to the second output line in the first and second periods.

8. The photoelectric conversion device according to claim 7 further comprising:
a column circuit that processes the signal output to each of the first and second output lines;
a first switch arranged between the first output line and the column circuit; and
a second switch arranged between the second output line and the column circuit,
wherein the first and second switches are turned off in the first period, and are turned on in the second period.

9. The photoelectric conversion device according to claim 8,
wherein a third switch is disposed between the first and second output lines, and
wherein the third switch is turned on when the first switch or the second switch is turned off.

10. The photoelectric conversion device according to claim 1,
wherein the plurality of output lines includes first and second output lines that are arranged in a common column, and
wherein the pixel outputs the signal to the first output line in the first period, and outputs the signal to the second output line in the second period.

11. The photoelectric conversion device according to claim 10,
wherein the pixel includes:
a first selection transistor arranged between the amplification transistor and the first output line; and
a second selection transistor arranged between the amplification transistor and the second output line,
wherein, in the first period, the first selection transistor is turned on, and the second selection transistor is turned off, and
wherein, in the second period, the first selection transistor is turned off, and the second selection transistor is turned on.

12. The photoelectric conversion device according to claim 10 further comprising:
a column circuit that processes the signal output to each of the first and second output lines;
a first switch arranged between the first output line and the column circuit, and turned on in the first period; and
a second switch arranged between the second output line and the column circuit, and turned on in the first and second periods.

13. The photoelectric conversion device according to claim 10 further comprising a column circuit connected to the first and second output lines,
wherein the column circuit processes the signal output from the second output line, and does not process the signal output from the first output line.

14. The photoelectric conversion device according to claim 1,
wherein a plurality of color filters is arranged for the plurality of photoelectric conversion elements, and
wherein colors of the plurality of color filters are different from each other.

15. The photoelectric conversion device according to claim 1,
wherein the first and second periods are included in a period that starts when a signal based on the charge transferred to the input node from a pixel arranged in a fourth row is output to one of the output lines and ends when a signal based on the charge transferred to the input node from the pixel arranged in the fourth row is output to one of the output lines next time.

16. A method of driving a photoelectric conversion device that includes: a plurality of pixels arranged across multiple rows and multiple columns, each pixel including a plurality of photoelectric conversion elements generating charge, an amplification transistor having an input node for receiving a signal that is based on the charge generated in the plurality of photoelectric conversion elements, and a reset transistor supplying a reset voltage for the input node; and a plurality of output lines disposed for the pixels that are arranged along the columns, the method comprising:
in a first period, electrically disconnecting the input node from the plurality of photoelectric conversion elements, and outputting a signal based on the reset voltage at the input node from a pixel arranged in a first row of the multiple rows to one of the output lines,
in a second period, outputting a signal based on the reset voltage at the input node and a signal based on the charge transferred to the input node from the pixel arranged in the first row to one of the output lines,
in a third period, outputting a signal based on the charge transferred to the input node from a pixel arranged in a second row of the multiple rows to one of the output lines, the second row being different from the first row,
in a fourth period, outputting a signal based on the charge transferred to the input node from a pixel arranged in a third row of the multiple rows to one of the output lines, the third row being different from the first and second rows, wherein the first period is a period prior to the second period, and is a period between the third and fourth periods.

17. An imaging system comprising:

the photoelectric conversion device according to claim 1; and a signal processing device that processes image signals output from the photoelectric conversion device.

18. The imaging system according to claim 17, wherein the signal processing device processes each of the image signals generated in the plurality of photoelectric conversion elements, and acquires distance information to an object from the photoelectric conversion device.

* * * * *